(12) United States Patent
Agarwal et al.

(10) Patent No.: US 7,443,814 B2
(45) Date of Patent: Oct. 28, 2008

(54) METHOD AND APPARATUS FOR SEGMENTATION, REASSEMBLY AND INVERSE MULTIPLEXING OF PACKETS AND ATM CELLS OVER SATELLITE/WIRELESS NETWORKS

(75) Inventors: Anil K. Agarwal, Gaithersburg, MD (US); Udayan N. Borkar, Germantown, MD (US); Moorthy N. Hariharan, Germantown, MD (US); Shekhar V. Patankar, Germantown, MD (US)

(73) Assignee: Viasat, Inc., Carlbad, CA (US)

( * ) Notice: Subject to any disclaimer, the term of this patent is extended or adjusted under 35 U.S.C. 154(b) by 891 days.

(21) Appl. No.: 10/809,899

(22) Filed: Mar. 26, 2004

(65) Prior Publication Data

US 2004/0179486 A1 Sep. 16, 2004

Related U.S. Application Data

(63) Continuation of application No. 09/462,896, filed on Mar. 3, 2000, now Pat. No. 6,819,658.

(60) Provisional application No. 60/052,539, filed on Jul. 17, 1997.

(51) Int. Cl.
*H04B 7/185* (2006.01)
*H04J 3/16* (2006.01)

(52) U.S. Cl. .................. 370/316; 370/347; 370/466

(58) Field of Classification Search ............ 370/310.2, 370/337, 338, 349, 389, 392, 395.1, 395.5, 370/395.6, 395.65, 468, 470, 472, 316, 466; 37/347

See application file for complete search history.

(56) References Cited

U.S. PATENT DOCUMENTS 4,815,071 A 3/1989 Shimizu
5,050,166 A * 9/1991 Cantoni et al. .............. 370/473
5,163,047 A * 11/1992 Perdikaris et al. .......... 370/401

(Continued)

FOREIGN PATENT DOCUMENTS

EP 0 777 395 6/1997

OTHER PUBLICATIONS

S.M. Jiang, et al, "An AAL3/4-Based Architecture for Interconnection Between ATM and Cellular Networks", IEEE International Conference on Communications (ICC), US, New York, IEEE, Jun. 8, 1997, pp. 1539-1543.

(Continued)

*Primary Examiner*—Hassan Kizou
*Assistant Examiner*—Mounir Moutaouakil
(74) *Attorney, Agent, or Firm*—Sughrue Mion, PLLC

(57) ABSTRACT

A method of transmitting information arranged in packets from one location to a second location via a wireless/satellite network, comprising: (a) examining each packet to determine whether its size is equal to a minimum (STEP 11A1) and (STEP 11A2); (b) if a minimum size, generating a first SAR header (STEP 11A4) and applying the header to packet to form a SAR segment (STEP 11A7); (c) if greater than a minimum size, dividing the packet into uniform sized segments (STEP 11A5), generating a second SAR header unique for each segment (STEP 11A6) and applying the header to respective segment to form SAR segments (STEP 11A7); (d) forwarding the SAR segments to modems for transmission to terminals at the second location (STEP 11A7).

17 Claims, 15 Drawing Sheets

U.S. PATENT DOCUMENTS

| | | | | |
|---|---|---|---|---|
| 5,412,655 | A | * | 5/1995 | Yamada et al. ............... 370/474 |
| 5,490,140 | A | * | 2/1996 | Abensour et al. ........... 370/352 |
| 5,515,106 | A | * | 5/1996 | Chaney et al. ................ 725/48 |
| 5,535,221 | A | | 7/1996 | Hijikata et al. |
| 5,553,069 | A | | 9/1996 | Ueno et al. |
| 5,570,362 | A | * | 10/1996 | Nishimura .................. 370/466 |
| 5,638,371 | A | * | 6/1997 | Raychaudhuri et al. .. 370/310.2 |
| 5,684,791 | A | | 11/1997 | Raychaudhuri et al. |
| 5,781,561 | A | * | 7/1998 | Machida et al. ............. 714/752 |
| 5,781,598 | A | | 7/1998 | Hardy, III |
| 5,790,544 | A | | 8/1998 | Aho et al. |
| 5,883,893 | A | | 3/1999 | Rumer et al. |
| 6,097,733 | A | * | 8/2000 | Basu et al. .................. 370/468 |
| 6,172,972 | B1 | * | 1/2001 | Birdwell et al. ............. 370/349 |
| 6,172,975 | B1 | * | 1/2001 | Sallee ........................ 370/359 |
| RE37,494 | E | | 1/2002 | Cantoni et al. |
| 6,434,137 | B1 | * | 8/2002 | Anderson et al. ........... 370/347 |
| 6,859,442 | B1 | * | 2/2005 | Agarwal et al. ............. 370/316 |

OTHER PUBLICATIONS

Mauger, R. et al, "QOS Guarantees for Multimedis Services on a TDMA-Based Satellite Network", IEEE Communications Magazine, US, IEEE Service Center, vol. 35, No. 7, Jul. 1, 1997, pp. 56-58, 63-64.

D. Lutas, et al "Multiprocessor System for Interconnnection of Ethernet and FDDI Networks using ATM via Satellite" IEE Proceedings: Computers and Digital Techniques, IEE, GB, vol. 143, No. 1, Jan. 25, 1996, pp. 69-78.

Akyildiz I.F., et al, "Satellite ATM Networks: A Survey", IEEE Communications Magazine, IEEE Service Center, Piscataway, vol. 35, No. 7, Jul. 1, 1997, pp. 30-43.

* cited by examiner

METHOD AND APPARATUS FOR SEGMENTATION, REASSEMBLY AND INVERSE MULTIPLEXING OF PACKETS AND ATM CELLS OVER SATELLITE/WIRELESS NETWORKS

This is a continuation of application Ser. No. 09/462,896 filed Mar. 3, 2000 now U.S. Pat. No. 6,819,658, which claims benefit of Provisional Application No. 60/052,539 filed Jul. 17, 1997; the above noted prior applications are all hereby incorporated by reference.

FIELD OF THE INVENTION

The present invention relates to the efficient and reliable transmission of packet or cell-based information, such as frame relay, SS7, ISDN or asynchronous transfer mode (ATM) based information, via wireless links. More specifically, the present invention relates to a method and apparatus for segmentation, reassembly and inverse multiplexing of packets and ATM cells over satellite and wireless links in a way that minimizes the requisite overhead contained in packet, cell and frame headers.

BACKGROUND OF THE INVENTION

There are a variety of methods for transmitting information via a broadband Integrated Services Digital Network (B-ISDN), using a variety of protocols related to Asynchronous Transport Mode (ATM), frame relay mode, ISDN and SS#7 modes of transmission. The ATM mode, as the exemplary preferred embodiment, was originally investigated by a group called the International Telephone and Telegraph Consultative Committee (CCITT). The group, currently called the International Telecommunication Union—Telecommunications Standards Sector (ITU-TSS), investigated a new form of ISDN that would have the flexibility to accommodate a large number of channels and the ability to transfer large amounts of data at a very fast rate. At the end of the study, the committee decided to adopt ATM as the target transfer mode for the B-ISDN. The ITU-TSS is currently defining the wide area network (WAN) standards for ATM.

ATM is a transfer mode that sends 53 octet-sized packets of information across a network from one communication device to another. The 53 octets are assembled as a "cell", which comprises 48 octets of data information, referred to as the "payload", and 5 octets of "header" information (including the routing information). The header and data information must be organized into cells so that when the cells are filled, they can be sent when an open slot of 53 octets becomes available.

There are two forms of headers that are specified in the CCITT Recommendation I.361. Each form is 5 octets long. There also are two different ATM network connections, each one having a different type of header. One connection form is the user-network interface (UNI), which is used between the user installation and the first ATM exchange and also within the user's own network. The other form of connection is the network-node interface (NNI) which is used between the ATM exchanges in the trunk network. The header format for the UNI consists of the following fields:

Generic flow control (GFC) field of 4 bits. It can provide flow control information towards the network from an ATM endpoint.

Routing field of 24 bits. Eight of the bits are VPI (virtual path identifiers) and 16 bits are VCI (virtual channel identifier). Empty cells with both the VCI and VPI set to zero indicates that the cell is unassigned.

Payload type (PT) field of 3 bits. This field is used to provide information on whether the cell payload contains user information or network information. This field is used by the network to intercept any important network information.

Cell loss priority (CLP) field containing 1 bit. This field may be set by the user or service provider to indicate lower priority cells. If the bit is set to 1 the cell is at a risk of being discarded by the network during busy times.

Header error control (HEC) field of 8 bits. This field is processed by the physical layer to detect errors in the header. The code used for this field is capable of either single-bit error-correction or multiple-bit error-detection.

As seen in FIGS. 1A and 1B, the header format for the NNI is the same as the header information of the UNI except that there is no GFC, and the VPI of the routing field is 12 bits instead of 8 bits.

Error detection occurs only within the header message. No error detection of the data occurs within the information portion of the cell. The receiving endpoint determines whether the data can be corrected or whether it must be discarded. When a link or node becomes busy, an ATM network must discard cells until the problem is resolved. The first cells to be discarded are the cells that have a CLP bit in the header set to a "1". Since connection endpoints are not notified when a cell is discarded, higher layers of protocols are needed to detect and recover from errors.

A cell is sent along a channel called a Virtual Channel Connection (VCC). A VCC consists of a series of links that establish a unidirectional connection through the network that allows the flow of information from one endpoint to another endpoint. Cells on a VCC always follow the same path through the network. Therefore, each cell arrives at its destination in the same order in which it was transmitted. VCCs can be unidirectional or may occur in pairs, thus making the connection bi-directional. VCCs can be within a Virtual Path Connection (VPC), meaning a group of virtual channels that are associated together, so as to be sent as a large trunk for a part of network. The VCCs are multiplexed and demultiplexed at appropriate network nodes in the network. Each VCC and VPC have specially assigned numbers called Virtual Channel Identifiers (VCI) and Virtual Path Identifiers (VPI), respectively. These numbers help the system determine the direction in which the cells belonging to the connection should be sent and which applications should be associated with the connection.

Although ATM-based transmission, switching, and network technology has been employed in broadband integrated services digital networks (B-ISDN) which rely on fiber optics, there are numerous difficulties associated with implementing ATM based technology in a wireless communication network. These difficulties include the fact that ATM-based networks and switches rely on a number of high speed interfaces. These high-speed standard interfaces include OC-3 (155 Mbit/s), OC-12 (622 Mbit/s) and DS3 (45 Mbit/s). However, a few ATM based networks and switches support lower speed interfaces, such as T1 (1.544 Mbit/s) and the programmable rate RS-449 interface.

As a consequence, there are only a few interfaces which can support the comparatively low transmission rates (less than 1 Mbit/s to a 8 Mbit/s) used in wireless communication. Although commercial satellite and wireless modems support these low transmission rates using an RS-449 programmable rate interface, it is difficult to implement ATM based technology in a wireless environment using conventional interfaces, such as the satellite environment seen in FIG. 2, because most ATM traffic is transmitted over high rate data interfaces. FIG. 2 illustrates the interconnection by a satellite relay between multiple terminals (Terminal 1 and Terminal 2, merely by way of example), using a time division multiple access (TDMA) network wherein bursts of information are sent to the satellite in a time divided manner for assembly and distribution to the terminals in a frame format.

Another difficulty associated with implementing ATM based technology in a wireless communication network has to do with the fact that ATM based protocols rely on extremely low bit error ratios which are typical of fiber optics based networks. By way of example, ATM protocols assume that the transmission medium has very low Bit Error Ratios (BER) ($10^{-12}$) and that bit errors occur randomly.

In contrast, the bit error ratios associated with wireless communication are much higher (on the order of $10^{-3}$ to $10^{-8}$) and tend to fluctuate in accordance with atmospheric conditions. In addition, the errors associated with wireless communication tend to occur in longer bursts. Thus, a robust error correction scheme must be employed in a wireless network in which ATM based technology is to be implemented.

In addition to the difficulties discussed above, there is another significant constraint placed on wireless communication networks which is not imposed on terrestrial based fiber optics networks. This constraint has to do with the fact that the cost of bandwidth in a wireless network is much higher than for fiber optics networks. As a consequence of having been traditionally implemented in fiber optics networks, ATM based technology is not particularly efficient in its use of transmission bandwidth. Therefore, if ATM-based technology is to be implemented in wireless networks, it must achieve a more efficient use of bandwidth.

Networking protocols have evolved over the years. Protocols have evolved from supporting the low rate X.25 kind of services to carrying high rate ATM traffic. Therefore, today's networks are required to support several different protocols like X.25, TCP/IP, Frame Relay, ISDN, SS7, etc. Protocols such as Frame Relay, IP and X.25 have variable size traffic. ATM on the other hand has fixed size cells. Therefore a network supporting multiple protocols must be capable of transporting variable size data.

Transmission links themselves limit the maximum packet size that can be transmitted over the link. This requires a variable length packet to be split into smaller segments before transmission and be put together at the destination before delivering to the user. The process of splitting the packet is called segmentation. The process of reconstructing the original packet is called reassembly.

Often nodes in a network are interconnected using multiple transmission links. This is done sometimes to get additional bandwidth, sometimes because the network topology demands it, or for redundancy. When packets are transmitted over these links, they may appear out of order at the destination node. Users expect that packets be delivered back to them in the order in which they were sent to the network. Therefore, packets need to be resequenced before they are delivered to the user. This process is also commonly referred to as "inverse multiplexing". The terms "resequencing" and "inverse multiplexing" are used interchangeably herein.

Networks have also evolved in complexity. Older networks traditionally used static bandwidth management schemes. Today's networks do "bandwidth-on-demand", i.e. bandwidth is continuously changing while the network is carrying traffic. Therefore, the solutions developed should work in a bandwidth-on-demand environment.

The problems of segmentation, reassembly and resequencing have been addressed before. However, existing solutions do not meet the needs of a bandwidth-on-demand satellite network. Some of the current approaches have relatively large segment headers. Bandwidth is a precious resource in a satellite network. If these solutions were to be applied to a satellite network, they would waste a lot of bandwidth. This is especially important if the network must carry ATM traffic, since the payload size per cell is fairly small (ATM cells have a 5 byte header and 48 bytes of data). Also, the current algorithms, like the IP reassembly algorithm, are more complicated and have a higher processing power requirement. This makes it harder to implement the algorithm in software for intermediate data rates (e.g. 8 Mbits/sec). Special hardware is required, which raises the cost of the product.

In bandwidth-on-demand networks, the bandwidth to different destinations from each node is continuously changing. The above algorithms for segmentation, reassembly and resequencing must be capable of adapting to the varying bandwidth.

Some cell- or packet-based protocols, such as Frame Relay and ATM, are connection oriented while others, like IP are datagram oriented. Any solutions developed should be able to work with both connection- and datagram-oriented protocols. This also makes it easier to handle network management traffic.

Low rate modems are simpler and cheaper to build. They also impose less stringent power requirements on the system. Therefore, it is desirable that each terminal be equipped with a low rate modem, that terminals be stacked up, and that every terminal in the stack be allowed to use spare capacity on other terminals. This is a simpler and less expensive system model as opposed to a single high rate modem. Segments may then have to travel through intermediate terminals on the path from the source to the destination. The algorithms should be capable of supporting this model.

Two algorithms that have been used for segmentation and reassembly in the past are the IP and the ATM AAL-5 s algorithms. However, each of these algorithms has deficiencies that are overcome by the present invention.

The IP segmentation algorithm inserts a packet number and the byte offset of the segment relative to the start of the packet in every segment. The use of a byte offset is required because IP has to deal with different protocol data unit (PDU) sizes across different transmission links in the network. IP packet headers are fairly large, which results in a substantial amount of wasted bandwidth. Also, the IP reassembly algorithm has to keep a list of previously received segments of each packer, typically in a predetermined location. Therefore, on receiving a new segment, a search must be performed in order to find the proper location of the new segment in the list.

The ATM AAL-5 algorithm works on a per-virtual circuit (VC) basis. Therefore, it cannot handle datagram traffic without first creating special VCs to carry such traffic.

Traditionally inverse multiplexing has been circuit-based, used primarily to get more bandwidth between two nodes using multiple fixed rate trunks and to compensate for variable delays encountered in the network. The traditional model for inverse multiplexing is shown in FIG. 3. In this model the source network nodes 10 and the destination network nodes 20 are connected to a network 50 via special hardware units called an inverse multiplexer 30. Each node, in fact, will have both source and destination components, as shown. The inverse multiplexers 30 are also interconnected using multiple low or intermediate rate trunks 40. The assembly provides a high rate pipe between the two network nodes.

In the case of a bandwidth-on-demand satellite network, the transmission capacity to different destinations increases and reduces dynamically. However, the traditional inverse multiplexing model does not permit dynamic changes in bandwidth or, in particular, the use of spare capacity on other co-located terminals for sending segments through them.

More recently, packet-based inverse multiplexing schemes, such as the one used by the Multilink Point-to-Point (MLPTP) have been proposed. However, in that method, each segment needs a sequence number, a requirement that increases header size and reduces efficiency.

Accordingly, it is an object of the present invention to provide a method and apparatus for the segmentation, reassembly and inverse multiplexing of packets and cells over satellite/wireless links.

It is a further object of the present invention to provide a low transmission rate interface comprising a method and apparatus for the segmentation, reassembly and inverse multiplexing of packets and cells.

It is yet another object of the present invention to provide an interface that supports a plurality of cell- and packet-based protocols with both fixed and variable sized traffic.

It is another object of the present invention to provide a low transmission rate interface comprising a method and apparatus for the segmentation, reassembly and inverse multiplexing of packets and cells using protocols that are either datagram or connection oriented.

SUMMARY OF THE INVENTION

The present invention overcomes the above-mentioned problems associated with implementing cell- or packet-based technology in a satellite/wireless communication network and achieves the stated objects by providing a unique frame format for a communication signal containing a bit stream having cell- or packet-based formatted data.

The present invention comprises a method and apparatus for providing segmentation, reassembly and inverse multiplexing in bandwidth-on-demand satellite/wireless networks.

The present invention further comprises a segmentation process and apparatus for inserting a sequence number, source and destination node information in every segment of a packet. The inserted information is used to identify all segments of the same packet on reception and to reconstruct the original packet.

The present invention further comprises a segmentation process and apparatus in which source and destination node information is derived implicitly, so it doesn't have to be transmitted over the link. More particularly, the present invention further comprises an inverse multiplexing process and apparatus based on an algorithm that works within a frame, using an implicit preference order of transmission of segments in bursts. Such order is known to both the sender and the receiver, so the receiver can sort segments to restore their original order.

In the method and apparatus of the present invention, the protocol data units (PDUs) transmitted over a satellite link have a fixed size.

In the method and apparatus of the present invention, segments that are formed and transmitted out of sequence are resequenced before reassembly. Further, a subsequent segment in a sequence is always appended to a packet as it is thus far assembled, thereby making the assembly algorithm simple with fewer lines of code. Moreover, the assembly algorithm used in the method and apparatus of the present invention does not use a sequence number for the resequencing operation.

The algorithms used in the method and apparatus of the present invention are adapted to provide the following advantages over existing algorithms:

1. Since the algorithms require smaller transmission headers for each segment, a significant savings in bandwidth is achieved.

2. Since inverse multiplexing is performed prior to packet and cell reassembly, the reassembly algorithm can be simplified, since the algorithm can predict for each packet or cell the precise segment to expect next.

3. The inverse-multiplexing algorithm is simpler than conventional algorithms, such as ATM AAL-5 and IP algorithms, and the time taken for cell or packet transmission is directly proportional to the rate of data transfer between the two nodes.

4. Since the algorithms are both cell- and packet-based, they are suitable for use in bandwidth-on-demand networks.

5. The algorithms are designed for a network in which terminals at a site can be stacked together. The terminals at the same site communicate using a local area network (LAN). Any terminal at a site can use spare capacity at any other terminal at the same site.

BRIEF DESCRIPTION OF THE DRAWINGS

These and other features, aspects and advantages of the present invention will become better understood with reference to the following description, appended claims, and accompanying drawings, in which:

DETAILED DESCRIPTION OF THE PREFERRED EMBODIMENTS

The subject matter of the present invention is generally applicable to cell and/or packet-based information formats for use in time division transmission systems, such as TDMA and TDM. For purposes of a preferred embodiment, the invention may be best illustrated with respect to its application to communications within an ATM-based or frame relay network that includes links via wireless or satellite using TDMA transmissions. In a first preferred embodiment, the invention is based on an interface that uniquely identifies ATM cells or packets for transmission of ATM-based traffic in a wireless communication network using TDMA. The interface may also facilitate the transmission of ATM-based traffic over a TDM-based network. Application of the invention to other cell- or packet-based information formats will be readily apparent to one of ordinary skill in the art.

The present invention specifically concerns a novel scheme, incorporated in the interface of a terminal that connects to a wireless terrestrial or satellite system that uses the point to multi-point capabilities of TDMA or TDM techniques for multiple access by transmitting/receiving stations to a shared communication medium.

Figure 4A:
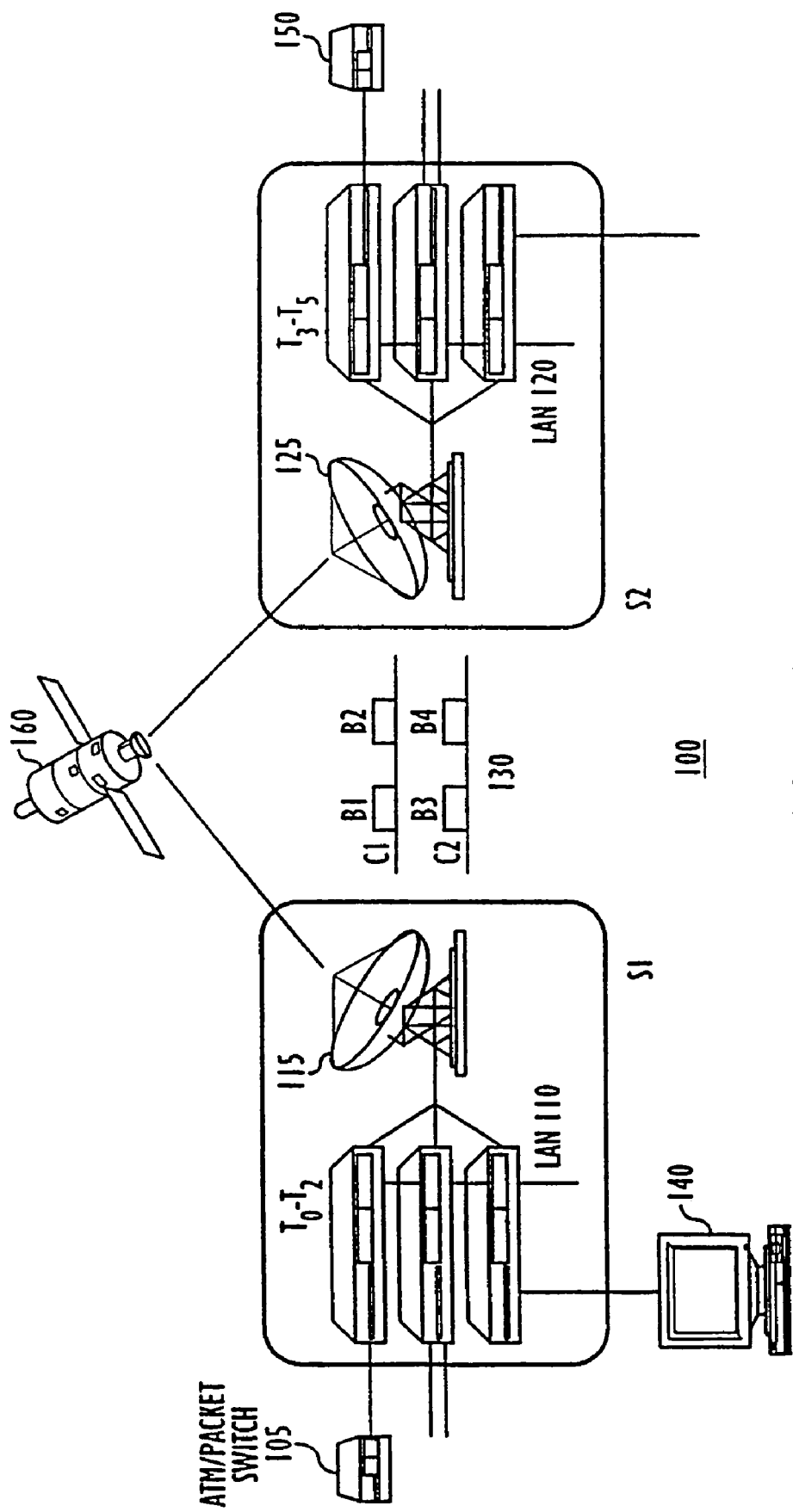
FIGS. 4A and 4B show schematic diagrams of a network reference model and an interface design that is relevant to the present invention.

FIG. 4A is a schematic illustration of a communication system 100 involving a network control center (NCC) 140 and plurality of terminals (T0-T5) that are arranged into physically distributed sites (two in the illustration: S1, S2). Each site S1, S2 has respective terminals (T0-T2; T3-T5) connected by a respective local area network (LAN) 110 and 120. The sites S1, S2 are themselves connected by a terrestrial wireless or satellite link 130 that can operate in any range of frequencies, e.g., the range of 2.4 Kb/s to 8.448 Mb/s for a satellite 160, and provide point to multi-point communication. Each terminal (T0-T5) has a built-in modem (as subsequently defined) and ATM/TDMA interface (not shown), the interface being used to transmit data to and from the satellite/wireless link 130 via antennas 115, 125, as shown in FIG. 4A. The ATM/TDMA interfaces are operative to provide high quality service for ATM-based applications and to provide an efficient use of transmission link bandwidth. In a typical application, the ATM/packet switches 105, 150 are connected to respective groups of computers directly or through LAN routers, for example. The interfaces have TDMA equipment, including modems, to connect together several terrestrial networks, using individual terminals, via satellite/wireless links 130 in a point to multi-point or mesh network.

The illustration in FIG. 4A is merely for explanation and, although only two sites S1, S2 are shown, where there is a larger number of sites, the sites may be organized into groups to which data can be simultaneously broadcast, such group being called a "control group". Further, while a network control center 140 is shown in FIG. 4A, as will be evident from the subsequent explanation of the invention, the terminals T(I) can operate in a distributed control environment as well.

Figure 4B:
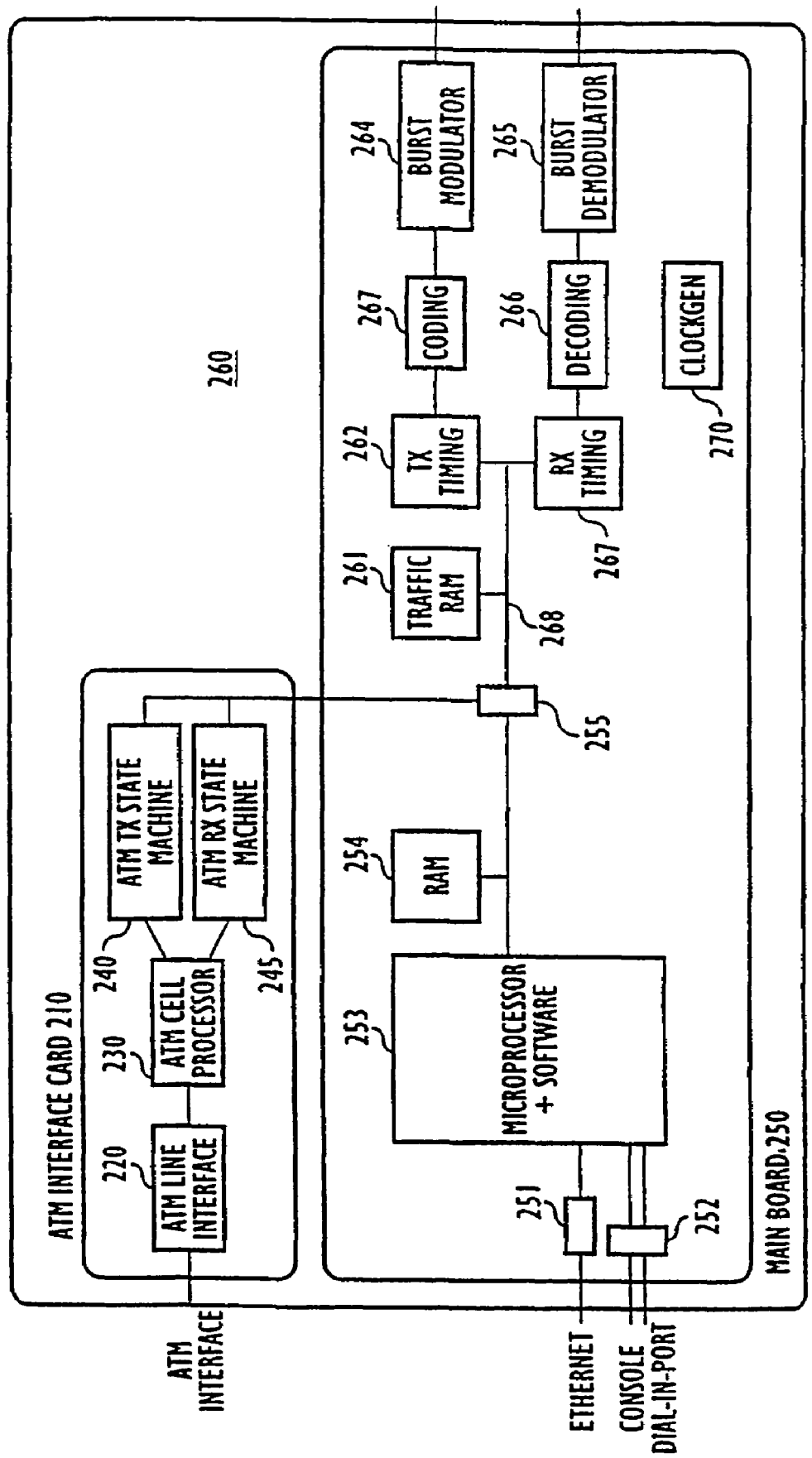

The ATM/TDMA interface 200 is illustrated in schematic form in FIG. 4B and comprises an ATM interface card 210 and a main processor board 250, typically both being mounted together. The ATM interface card comprises an ATM line interface 220 that interfaces the link between the ATM switch and an ATM cell processor 230. The processor 230 connects to both an ATM transmitter state machine 240 and an ATM receiver state machine 245 for arranging the incoming data and outgoing data on the transmission link. The two state machines connect to the main board which has an ethernet interface 251 and a console dial-in port interface 252, which together provide control information from a network control center or remote operator console to a microprocessor and applications software module 253, which represents all of the intelligence for the interface. Appropriate software modules are stored in RAM 254 for access by the microprocessor on demand. The microprocessor will control a signal interface 255 that receives the ATM communication information output from the ATM Tx state machine 240 and provide it to the transmission subsystem 260 on the main board, as represented by a traffic RAM 261 that stores incoming and outgoing transmission data, a transmission timing module 262 that controls the timing of the transmission, and the coding module 267 and burst modulator 264, that prepares the communication for transmission in burst form on a carrier. The transmission subsystem 260 also includes a burst demodulator 265 that receives the input burst received on a downlink carrier and a decoder module 266 that provides the decoded information to a receiver timing module 267 for presentation to the traffic RAM via bus 268 as well as a ?? generation 270. The data is transferred via interface 255, under control of microprocessor and software application 253 for input into the ATM receiver state machine 245. The ATM cell processor 230 will process the incoming data and provide it to an ATM line interface 220 for access by the ATM system and switch (not shown).

In the variety of networks that can incorporate the present invention, information is separated based on time division and is transmitted using a framing structure. Such a framing structure is commonly used in TDMAs satellite networks, but may also appear in other networks as well. For example, terrestrial networks also have framing structures (e.g. for T1 or E1 framing etc.). In this regard, a "frame" is a fixed period of time, and is delimited by some mechanism for identifying the start and end of that time period. In satellite networks, frames are usually of the order of milliseconds. A frame contains "bursts", each of which is a contiguous stream of information from a common source, the plurality of bursts in a frame typically being from different information sources. Where a terminal is to transmit a plurality of bursts in a frame, the beginning of transmission of the frame is defined as the "start of a transmit frame", henceforth called the "SOTF instant". Similarly, where a terminal is to receive a frame, the beginning of the frame when received is defined as the "start of receive frame" and the beginning of reception of the frame is henceforth called the "SORF instant".

Bursts contain channels, and information in the form of "data" is transmitted on the channels, often in cell or packet form. Conventionally, for channels carrying cell- or packet-based data, there are check bits on the channel that allow detection of errors in reception of data on that channel. It is assumed that when such errors cannot be corrected all data received in the channel is discarded. Each burst is defined by a fixed duration of time or "offset" (henceforth referred to as "burst offset") relative to SOTF or SORF, depending on whether the burst is being transmitted or received by that terminal, respectively. Bursts are transmitted repeatedly every frame. Each burst is assigned an identifier (id) called the "BurstId", which is unique in the network.

Typically, a network that can utilize the present invention contains several carriers. These carriers are defined by different frequencies. A burst will be allocated for transmission on a carrier. Consequently, bursts on the same carrier cannot overlap in time. However, bursts on different carriers may overlap in time. Each carrier is identified by a "CarrierId" which is unique in the network. Carriers are subdivided into "slots", and no two bursts can begin in the same slot in one carrier, i.e., burst offsets should fall in different slots.

Figure 5:
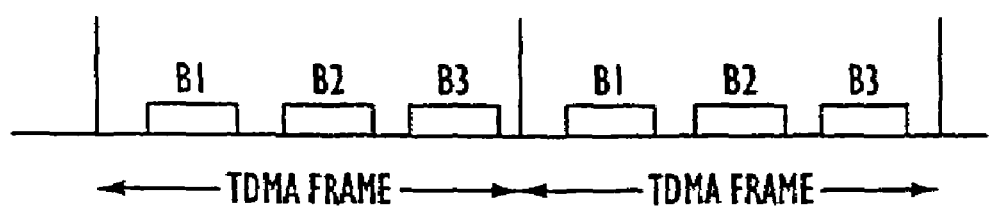
FIG. 5 illustrates the TDMA frame structure with three bursts B1, B2 and B3.

Turning again to FIG. 4A, the satellite/wireless link 130 is illustrated with the notation Bi (i=1, 2, 3, 4 . . . ) being used to denote bursts and Ci (i=1, 2 . . . ) to denote carriers. As illustrated, each of a plurality of carriers may simultaneously transmit a stream of bursts that are organized on a time division basis. FIG. 5 shows the structure of a TDMA frame for such time S division transmission, wherein two successive frames are shown on a single carrier, each frame having three bursts B1, B2 and B3. From this illustration, it can be understood that the bursts B1 in each of the frames relate to the same data source and are merely separated in time; the same being true for bursts B2 and B3.

The equipment in terminals T(i) that are used for time division transmission and reception of information in bursts, particularly in TDMA communications as in the preferred embodiment, is collectively referenced herein as "modems". Bursts that are formed in the terminals by the time division equipment are allocated among modems for transmission, and are allocated at the receive end on the basis of carrier frequency. It is assumed that the terminal that transmits or receives a burst knows the offset of the burst relative to the start of the respective frame and the CarrierID of the Carrier on which it is transmitted. It is also assumed that if a terminal (e.g., T1) at a site (e.g., S1) uses a burst on another terminal (e.g., T3) to transmit its data, it is aware of the offset and the Carrier Id of the burst.

Figure 6:
FIG. 6 illustrates examples of a terminal ID format in accordance with the present invention.

In accordance with a basic principle of the present invention, bursts and packets are addressed to and from specific terminals. A terminal is identified by a unique id called the "Terminal Id" which is unique in the network. The format of the Terminal Id is shown in FIG. 6. Referring to the content of the figure, a twenty-four bit header is shown, comprising three fields. The first field (8 bits) identifies the "control group" to which the terminal belongs. The second field (11 bits) identifies the "site" within the control group to which the terminal belongs. The third field (5 bits) identifies the particular "unit" within the site. An all 1's site number and unit number is used as a broadcast address for all terminals in a control group. The lengths of the fields shown in FIG. 6 are as used in a preferred embodiment, but the applicable algorithms could easily be made to work with different lengths.

The packet formats shown are for the preferred embodiment, which is designed for transmission at a rate of 8 Mbits/sec of data transfer between adjacent nodes. However, clearly the concepts disclosed herein can easily be made to work with similar packet formats where the field lengths or data rates are different.

Turning next to the segmentation and reassembly features of the invention, these are performed on a hop-by-hop basis, i.e., at each transmission from one terminal to another, even though multiple hops may ultimately be involved. Each terminal has a packet segmentation sequence number. This is an unsigned number (i.e. after 65535 it wraps around to 0). At startup it is initialized to 0 and is then incremented for each packet as described below.

Figure 7A:
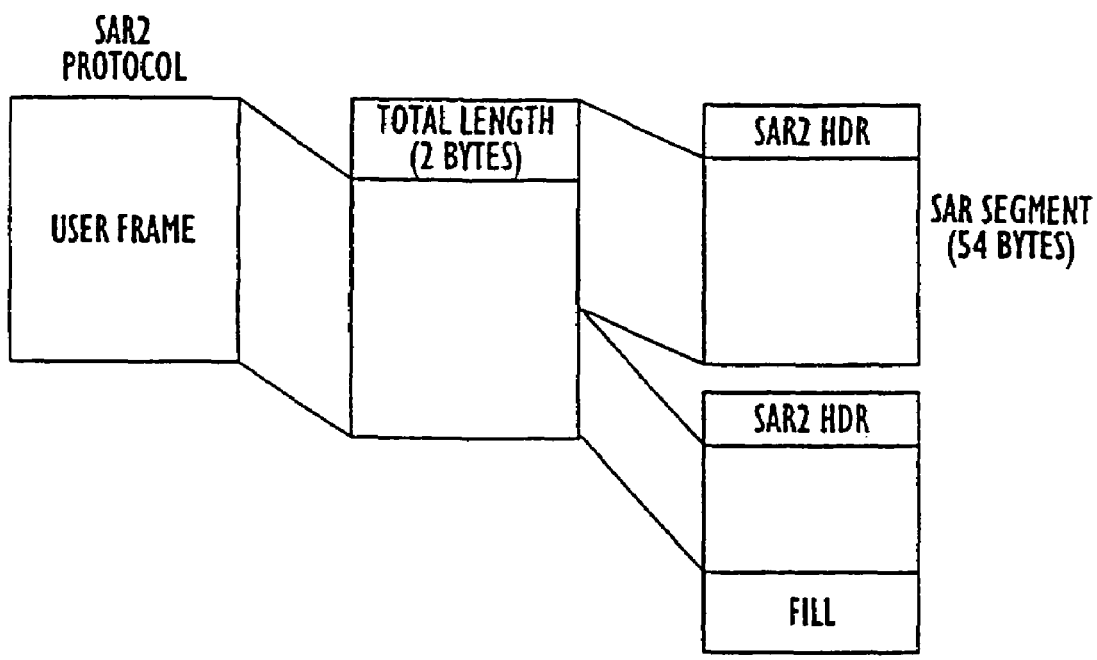
FIGS. 7A and 7B illustrates examples of segmentation in accordance with the present invention.
Figure 7B:
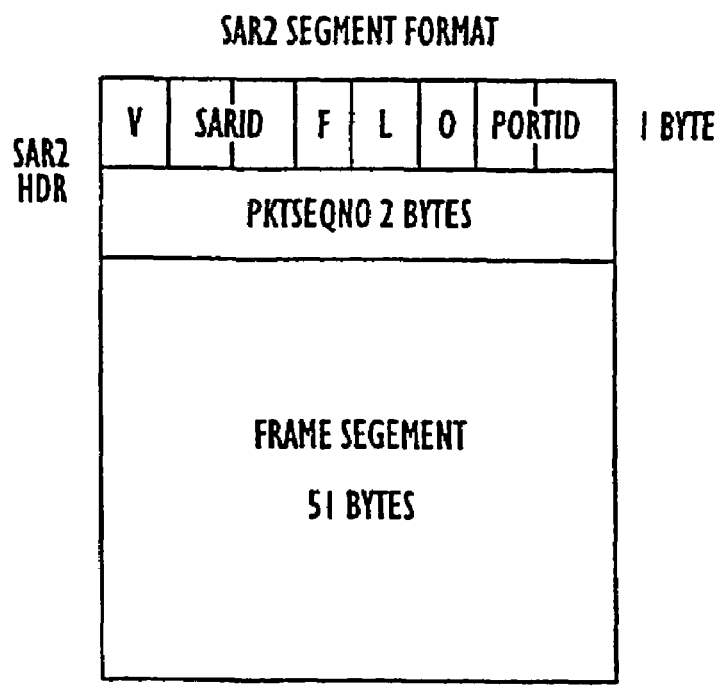

In operation, for example, it may be assumed that the transmission system has a protocol that permits transmission of information by variable length packets and that one such packet is originating at terminal T1 of FIG. 4A. Assuming a packet to be transmitted has a length of more than 51 byte segments, the length of the packet is defined (2 bytes) and that value is pretended to the packet. The packet itself is segmented into 51 byte data segments, each being combined with a SAR2 header to form a 54 byte SAR segment, as shown in FIG. 7A. The header that is pretended to each segment comprises a 3 byte SAR2 (segmentation and reassembly) header, as shown in FIG. 7B. The SAR2 header includes 2 bytes that define the packet sequence number (PktSeqNo) and one byte that contains bits defining validity (V), Said, first (F), last (L), optional (O) and Port-id.

The SAR header should be filled as follows. The "SAR Id" should be set to 1, and is incremented for each subsequent segment in a given packet. The "first" (F) and the "last" (L)bit indicators should be set to 1 in the first and the last segments of the packet. The "PktSeqNo" field in all segments should be set to the terminal packet segmentation sequence number, as it identifies the position of the packet among other packets at a given terminal. The "Port-id" is used to identify the application at the remote terminal to which the packet should be delivered. The Valid(V) bit is set at the time of transmission of the segment in a burst. If it is 1, it indicates that a segment carrying data is present, otherwise it indicates the presence of an empty SAR 2 segment. Empty segments are discarded upon reception and are not delivered to the resequencer. The optional bit (O) is reserved.

Once the bits in the header for all segments of a packet are filled, the terminal packet segmentation sequence number PktSeqNo is incremented by one and the process is repeated. Where the last segment does not contain a sufficient quantity of data, a fill pattern is used, comprising a predetermined pattern, i.e., all 1's.

Figure 8A:
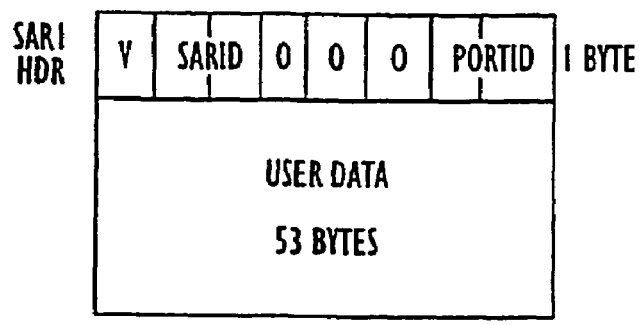
FIG. 8A illustrates a segmentation and reassembly (SAR) protocol data unit (PDU) for an ATM application, in accordance with the present invention.

For ATM cells, which are fixed in size (53 bytes), there is no segmentation. The 1 byte SAR1 header is pretended to the cell, as seen in FIG. 8A, resulting in a SAR of 54 bytes. The network is optimized for ATM cells and the ATM cell size of 53 bytes determines the segment data size of 51 bytes for SAR2 in order to have a uniform SAR segment size of 54 bytes in all cases.

Figure 8B:
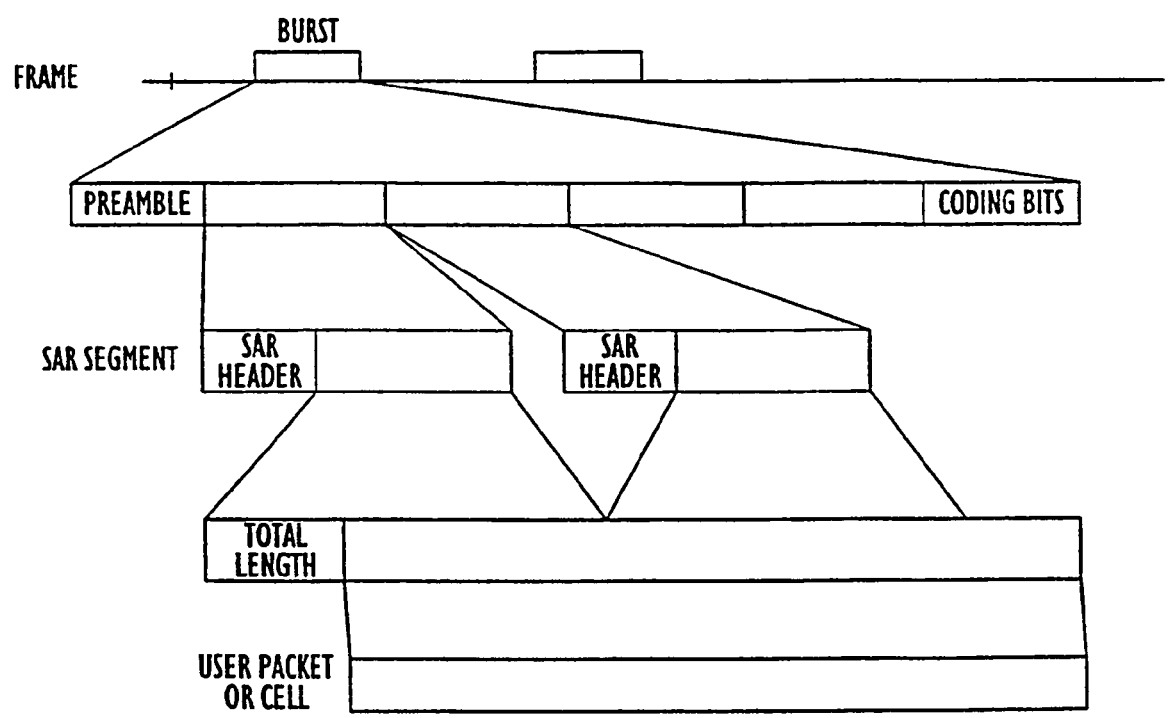
FIG. 8B illustrates the content of a frame carrying packets or cells within SAR segments in a burst.

FIG. 8B illustrates the content of a burst within a frame on a carrier that is used for the transmission of user packets or cells with a SAR segment arrangement. Seen within a burst is a preamble as a header followed by SAR segments and ending with coding bits for error control within each burst. Each SAR segment comprises a SAR header and followed optionally by a definition of the length of the packet and the user packet or cell.

Figure 8C:
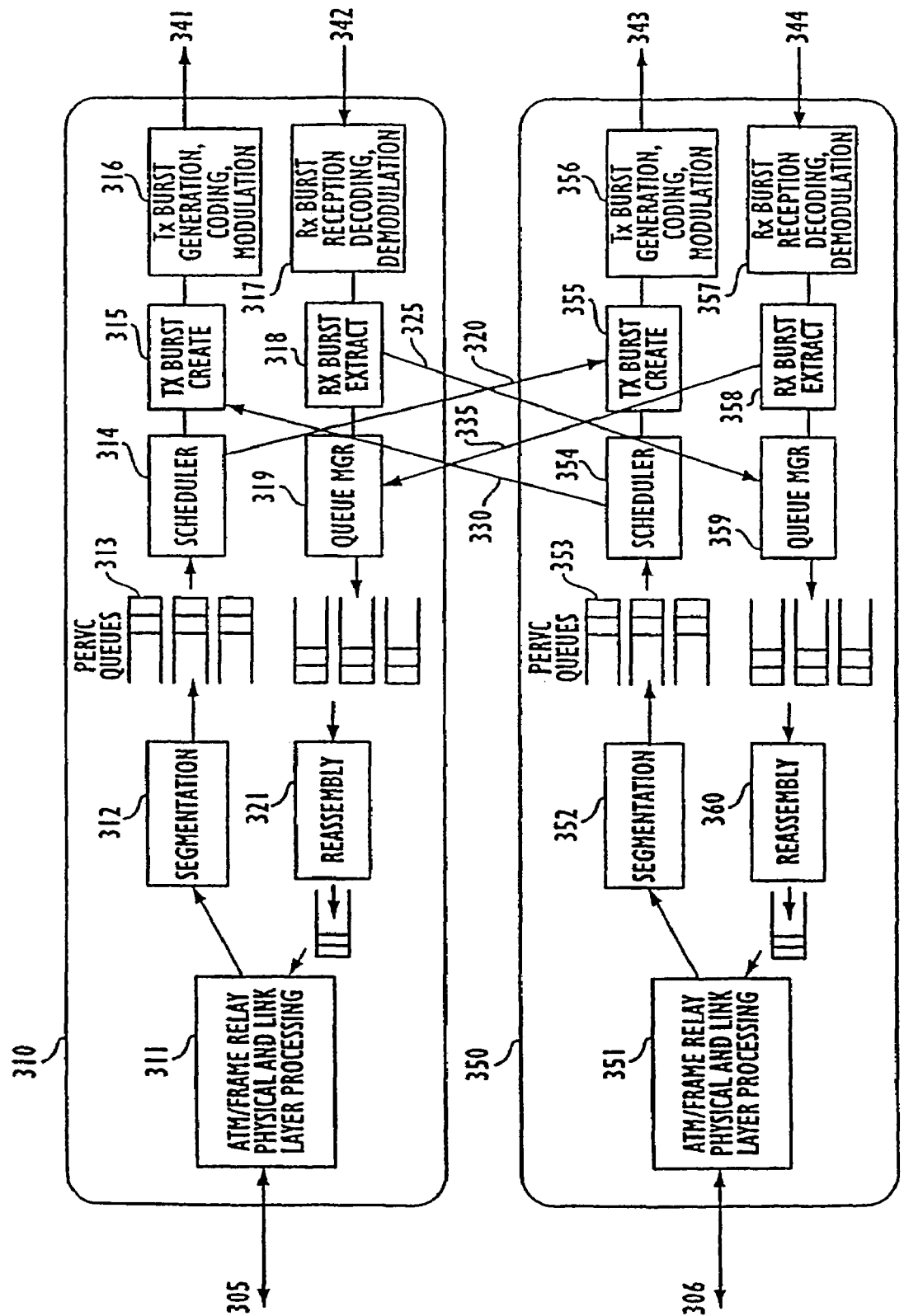
FIG. 8C illustrates the interconnection of units within two terminals that provides a variable bandwidth on demand.

The ability to provide variable bandwidth on demand at a given site 300 is provided by an arrangement as seen in FIG. 8C, for example. Two terminals 310 and 350, each having similar structures, are interconnected to provide an ability to handle overflow of required capability. ATM signals input from switches or terrestrial links via lines 305 and 306, respectively, are input to ATM/Frame relay physical and link layer processing in units 311, 351. In the output direction, the ATM signals are segmented at segmentation unit 312, 352 and presented to per-VC queues 313, 353 for organization, as disclosed herein, and subsequent burst creation in units 315, 355, followed by transmission burst generation, coding and modulation in units 316, 356 for output at terminals 341, 343. Where excess capacity is required and is available in a connected terminal, the schedulers 314, 354 are arranged to provide a portion of their output to the transmission burst creation unit 355, 315, respectively.

Similarly, on the receive side, the signals input at links 342, 344 are fed to receive burst reception, decoding and demodulation units 317, 357 and bursts are extracted in units 318, 358 for arrangement in queues 313, 353 for reassembly. The queue manager 319, 359 provide the received information to the appropriate queues, whether in the same terminal or another terminal via interconnection links 330, 335. The queues 313, 353 that receive the packets permit them to be reorganized and ultimately reassembled in units in reassembly devices 321 and 360. The information reassembled from the queues is reorganized into ATM or frame relay formats by appropriate physical and link layer processing in units 311 and 351.

In order to achieve efficiency for data transmission, each terminal will maintain a list of bursts on which that particular terminal is allowed to transmit. This list is kept sorted (e.g., by CarrierID, burst position in frame, channel in burst). Channels are picked in their order in the list for transmission of segments. The SAR segment is then sent to the appropriate modem for transmission. The destination and source terminal ids, burst id and channel ids are also sent with each segment. The modem appends received segments to the specified burst for transmission. Thus the order of transmission of segments in a burst is the same as the order in which the terminal sent those segments to the modem. The transmission format for segments in bursts is shown in FIGS. 9A-9C.

Figure 9A:
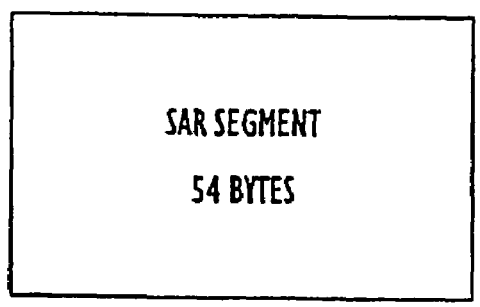
FIGS. 9A-9C illustrate Transmission PDU formats.

In Case 1 seen in FIG. 9A, the source and destination terminal ids of the segment are the same as the source and destination terminal ids for the burst. Hence, they do not need to be transmitted.

Figure 9B:
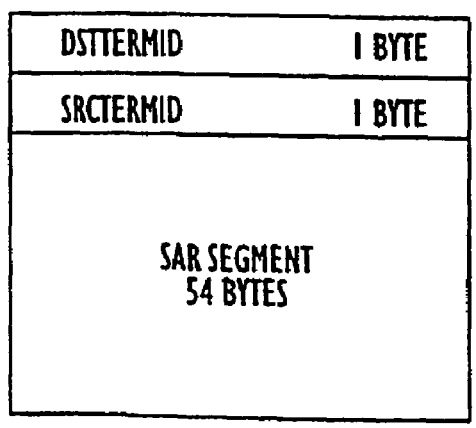

In Case 2 as seen in FIG. 9B, the burst originates from some modem at the same source site as the segment and is destined to some modem at the same destination site as the segment. Thus, the control group and site fields of the segment source terminal id are identical to the control group and site fields of the burst source terminal id. Therefore, only the unit id needs to be sent. Similarly, for the destination only the unit id field of the destination terminal id needs to be sent.

Figure 9C:
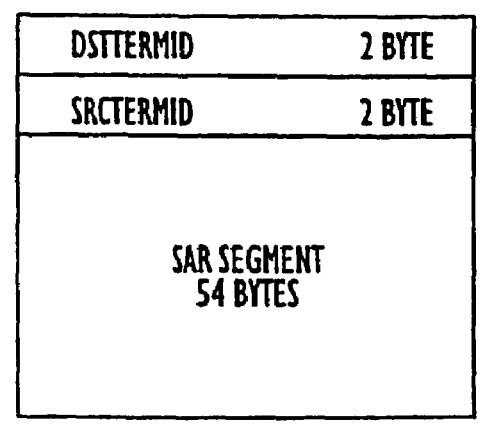

In Case 3, as seen in FIG. 9C, the source control group of the segment terminal id is identical to the source control group of the burst. Therefore, only the site and unit ids need to be sent. Similarly, for the destination only the site and unit id fields of the destination terminal id need to be sent.

Also, periodically the algorithm may be designed to scan queued up segments (every 50 millisecond) and discard those segments whose id's indicate that they have not been sent (due to lack of bandwidth) for too long of a period (1.5 secs). This technique prevents sequence number: wrap around. If this were not done, segments of two different packets from the same source terminal, with the same packet sequence number, could be present simultaneously at the same reassemble. This would result in a packet being reassembled incorrectly.

Figure 11A:
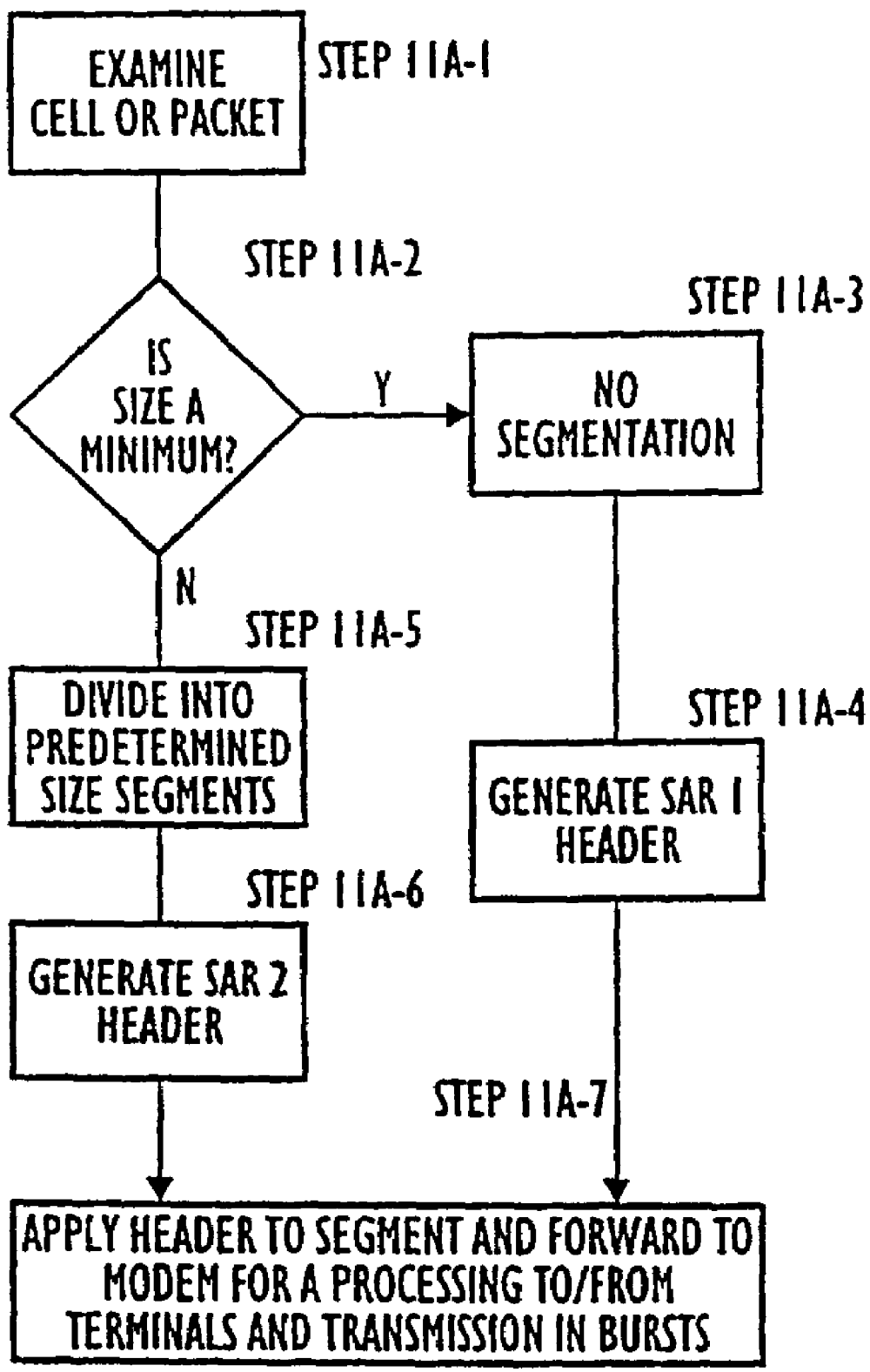
FIG. 11A is a flowchart illustrating the generation of SAR1 and SAR2 headers, with FIG. 11B illustrating the transmission of segments with SAR1 and SAR2 headers.

In operation, as seen in FIG. 11A, an incoming cell or packet is examined in step 11A-1 and in step 11A-2, a determination is made as to whether the size is equal to the minimum size, e.g., an ATM cell size. If the incoming packet or cell is only the minimum size, a decision is made at step 11A-3 that segmentation is not needed and in step 11A-4,the SAR1 header is generated. The SAR1 header comprises only one byte, as shown in FIG. 8. In step 11A-7, the header is applied to the data in the packet or cell and id forwarded to the modem at a selected terminal at a site for addressing to a destination terminal and transmission to that terminal in a predetermined burst. Where it is determined in step 11A2 that the incoming cell or packet is greater than a minimum size, there is a need to have the cell or packet segmented for transmission. Thus, in step 11A-5, the cell or packet is divided into predetermined size segments, followed by the generation of a SAR2 header in step 11A-6. As noted above, and as seen in FIG. 7A and 7B, the SAR2 header is a three byte header that changes for each segment and contains information sufficient to identify each segment in each packet by its terminal. Finally, the SAR2 headers are combined with appropriate segments and are forwarded to a modem for transmission in bursts.

Figure 11B:
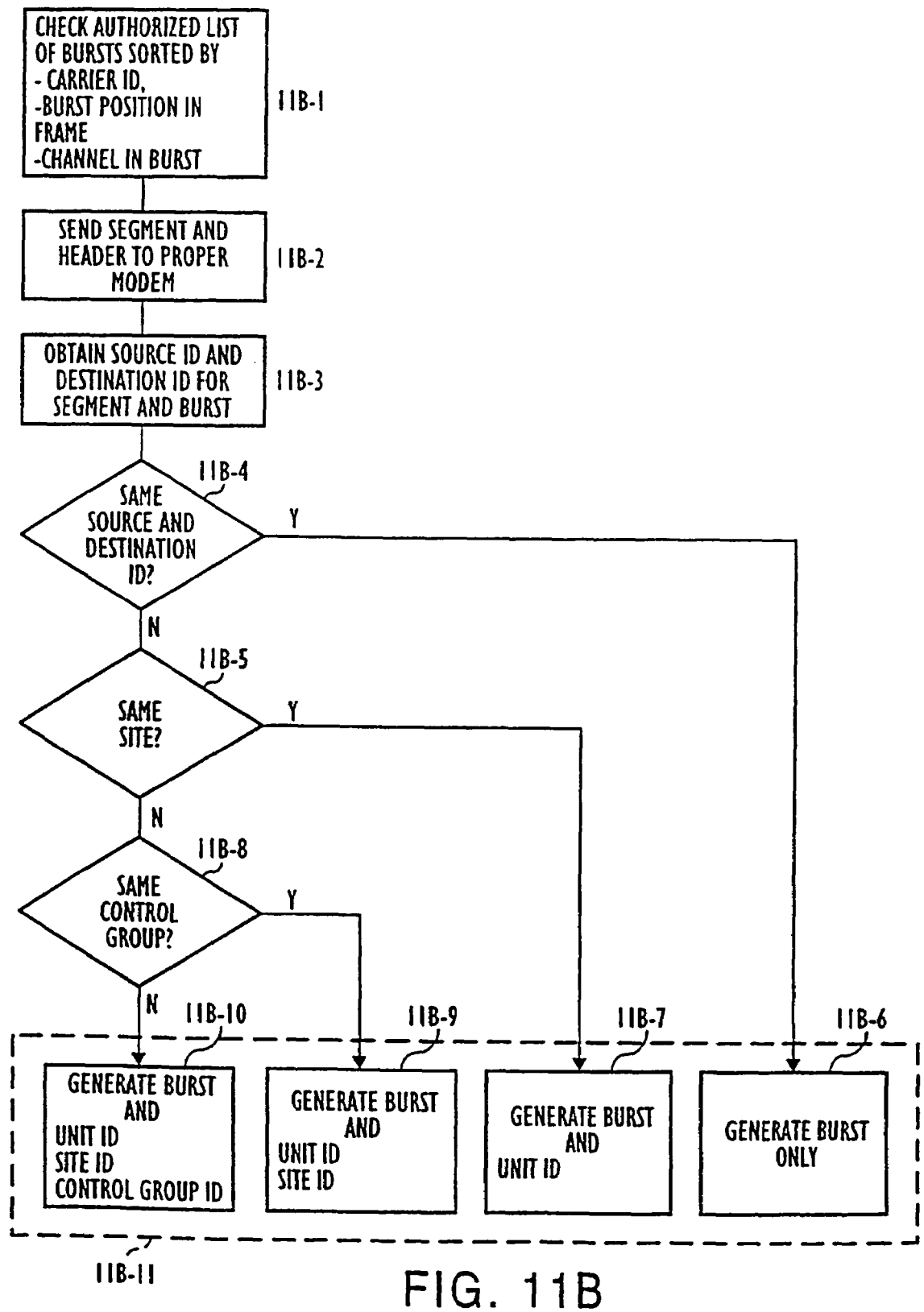

The transmission of the segments with SAR1 or SAR2 headers is undertaken on the basis of the process illustrated in FIG. 11B, where the nature of point-to-point transmissions is determined so that a minimum amount of overhead is used while ensuring accurate delivery and reassembly of the transmitted packets. Initially at a terminal, in step 11B-1, a check is made of a list of authorized bursts for a given terminal, the list being sorted by carrier id, burst position in frame, and channel in burst. The segment and appropriate header is sent to a proper modem in accordance with that list in step 11B-2. In step 11B-3, source id and destination ids are identified for both the segment and the burst, in order to determine what additional information must be sent. As this is a bandwidth on demand architecture, where the capacity of other terminals must be used to accommodate a high bandwidth requirement for a given transmission, a decision must be made as to how much additional information must be sent in order to properly reassemble the transmitted information at the receiving end. The goal is to transmit the minimum amount of needed overhead information in order to make most efficient use of the available bandwidth for information transmission. In order to meet this goal, in step 11B-4, an initial determination is made as to whether the burst and segment have the same source and destination id, i.e., are from the same terminals. If so, no information identifying the segment origin is needed and the burst is simply generated in step 11B-6 for transmission within step 11B-11. For such case, the transmission PDU format illustrated in FIG. 9A is used, where there are point-to-point bursts between sites which have only one terminal each. However, if it is determined that there is a difference, a check is made in step 11B-5 as to whether the segment and burst are from the same site, even though the units may differ. If that is the case, then the burst is generated with information identifying the unit in step 11B-7 and the combined burst and unit id is transmitted in step 11B-11. This case applies to a situation where there still are point-to-point bursts and one byte of header information is needed to identify the source and destination terminals, respectively. Where there is even a difference in site identified in step 11B-5, a determination is made in step 11B-8 as to whether at least there is a common control group, as case where there are non-point-to-point bursts. If so, in step 11B-9 a burst is generated and is combined with a unit id and site id for transmission in step 11B-11. Finally, if there is no commonality of at least control group in step 11B-8, in step 11B10 the burst is combined with the unit id, site id and control group id as seen in FIG. 6 and the combination is then transmitted in step 11B-11. The segments are transmitted in bursts in the order of their CarrierID and Bust Position in Frame.

Figure 1A:
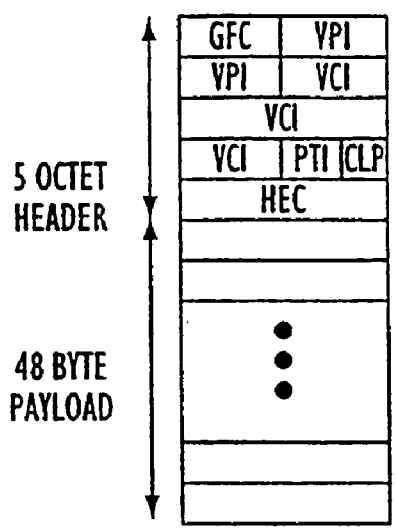
FIGS. 1A and 1B show an ATM cell structure having the UNI and NNI header formats, respectively.
Figure 1B:
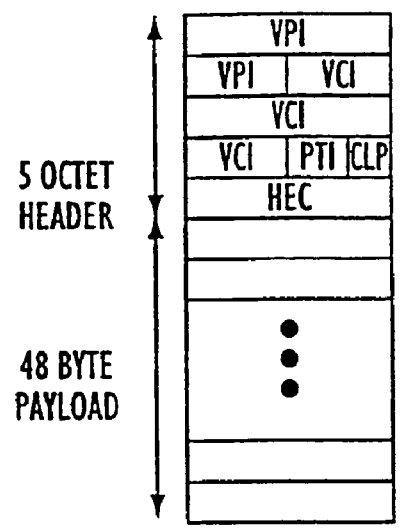
Figure 2:
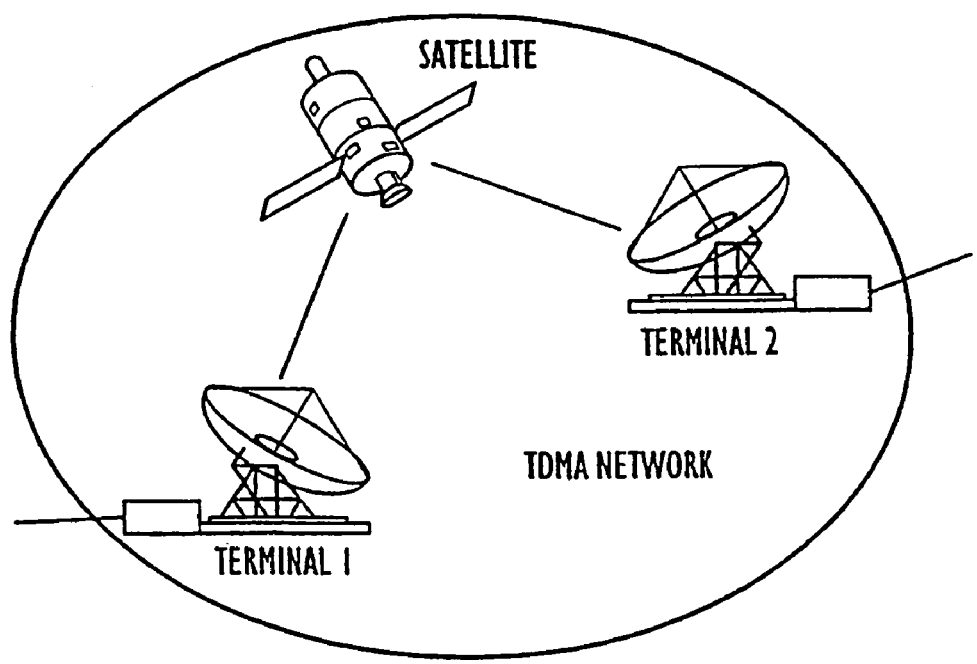
FIG. 2 shows a conventional wireless/satellite system arrangement.
Figure 3:
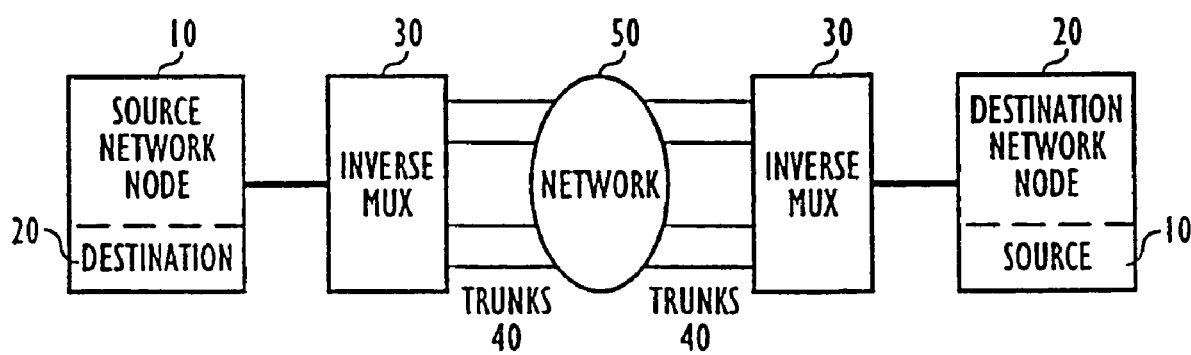
FIG. 3 shows a Traditional Model for Inverse Multiplexing.

As to the reception process, there is a basic requirement that bursts with any of a variety of required identification information must be extracted from the TDMA system at an addressed destination terminal for reception by a modem. With reference again to the traditional model for inverse multiplexing as seen in FIG. 3, when the principles of the present invention are applied thereto, the receiving modem processes segments in their order of reception in the burst. These segments are delivered to the inverse multiplexer 30 located at the terminal identified by the destination TerminalID of the segment. Broadcast segments also are sent to the inverse multiplexer 30 at this terminal. Since the segments were transmitted in bursts in the order of their CarrierID and Burst Position in Frame, sorting segments by their CarrierID and Burst Position in Frame restores the original order of the segments.

Figure 10:
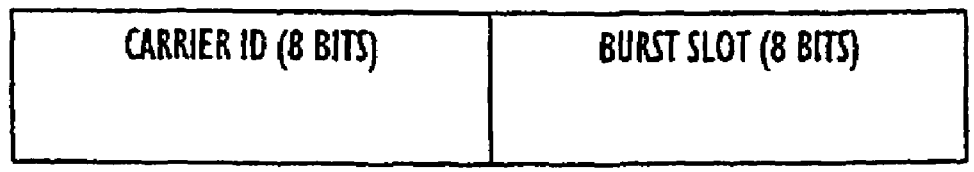
FIG. 10 shows a 16 bit key, relevant to the present invention.

Sorting is done within a received frame in two passes, one for resequencing and one for reassembly. There are two tables used for these two steps of the sort. This is done in order to reduce the memory requirement for the tables. Alternatively, sorting could have been performed in a single pass but it would require a table with 65536 buckets. Also, a large table implies is more time is required to scan empty buckets of the table. Each bucket of a table contains a queue of segments. At the beginning of each receive frame both tables are empty. The 16 bit key for the sort is composed as seen in FIG. 10, and comprises a CarrierID (8 bits) and a Burst SlotID (8 bits).

Figure 12A:
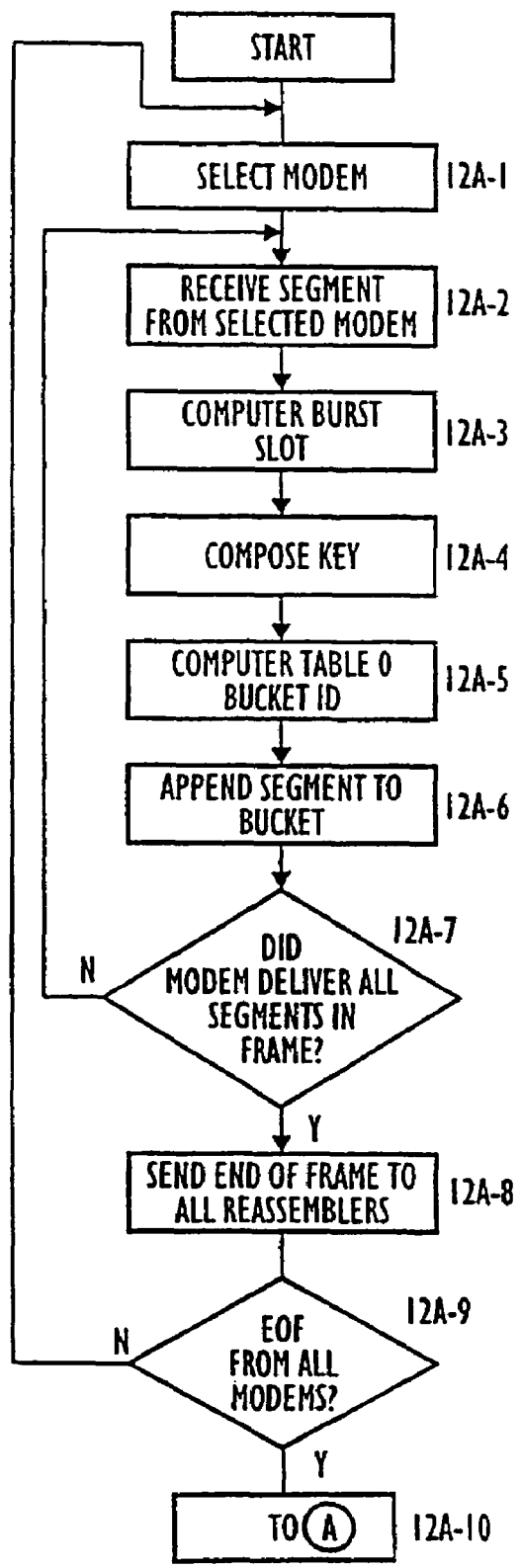
FIG. 12A is a flowchart illustrating the resequencing process, with FIG. 12B illustrating the reassembly process and FIG. 12C illustrating the process on receiving a variable length packet from the resequencer.

The use of 8 bits for CarrierID is based on an assumption that there are a maximum of 256 carriers in the network. The use of 8 bits for Burst SlotID is based on the assumption that the highest carrier data rate is 2 Mbits/sec and the smallest burst carries at least 8 kbps of data (2000000/8000=250). Let the number of bits in the key be bk. If this is odd, set bk to the next higher even number. The sizes of the two tables are then $2^{(bk/2)}$ each. With reference to FIG. 12A, a flow chart for the resequencing process is illustrated. Initially, one of the plurality of modems is selected in step 12A-1 and a segment from that modem is received in step 12A-2. On receiving a segment from a modem, its Burst Slot is computed in step 12A-3, as shown below, and the key is composed in step 12-A4.

Burst Slot=Burst Position*MaxSlotsPerCarrier/Frame Size where Burst Position and Frame Size are in the same units.

Then, in step 12A-5, the algorithm computes the Table_0 bucket as (key mod Table_0_Size). And in step 12A-6, the segment is appended to the queue for that bucket.

A check is made as to whether the modem has delivered all segments in the frame at step 12A-7 and the process returns to step 12A-2 until the answer is yes. When a modem has delivered all segments received in a receive frame, it sends the END_OF_FRAME marker to all resequencers at the site at step 12A-8. Thereafter, a check is made at step 12A-9 as to whether an END_OF_FRAME marker has been received from all modems. If not, the process returns to start and a modem that has not yet been processed is selected until all modems have issued an END_OF_FRAME marker. Needless to say, the process of assembling the segments for modems can take place in parallel, rather than in series, as illustrated solely for convenience and simplicity.

Figure 12B:
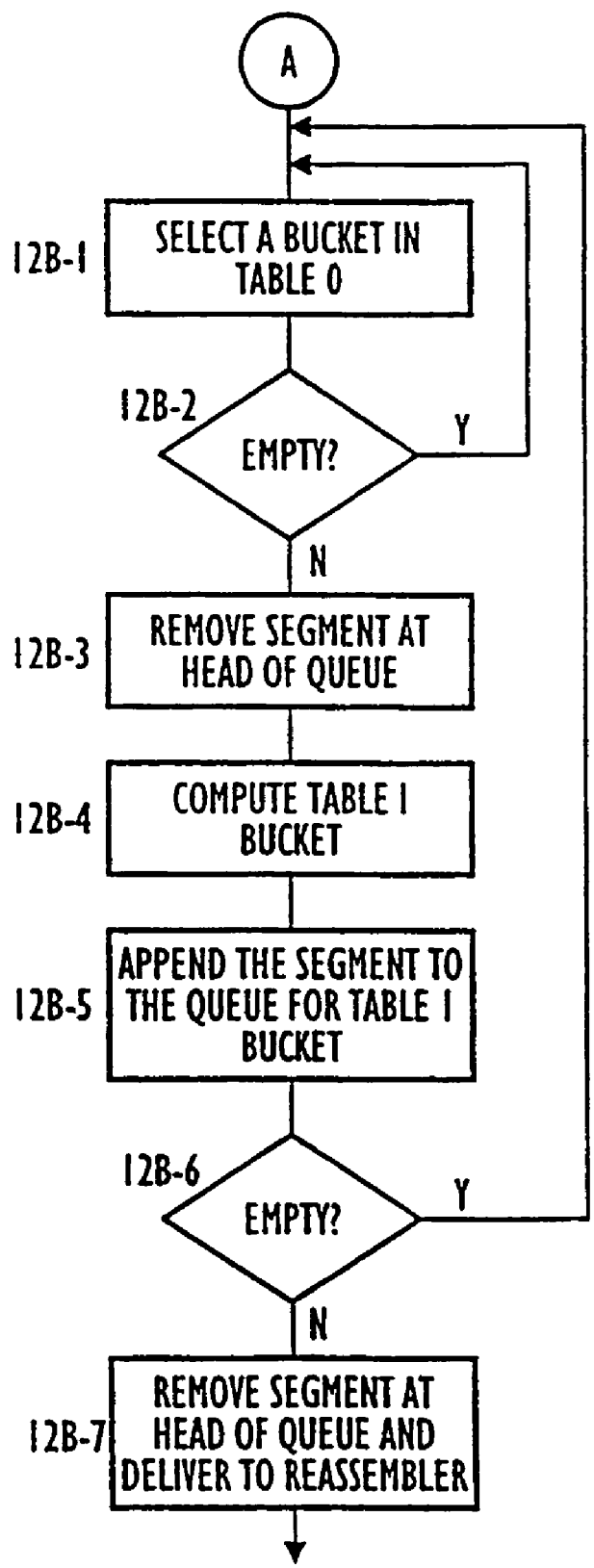

The second pass of the sort at a resequencer begins when the END_OF_FRAME markers have been received from all modems at this site. This reassembly process is illustrated in FIG. 12B and is described subsequently. Initially, in step 12B-1 a bucket is selected in Table 0 and a determination is made as to whether the queue in the bucket is empty, as seen in step 12B-2. Where not empty, the segment at the head of the queue is output, as seen in step 12B-3 and as described below:

```
:
    for each bucket (0 .. Table_0_Size – 1) in Table_0
    do {
        while the queue for the bucket is not empty {
            remove the segment at the head of the
            queue
            In step 12B-4, the Table_1 bucket is computed
            as (key / Table_0_Size) and in step 12B-5 the
            segment is "appended" to the queue for that
            bucket       }
    }
    for each bucket (0 .. Table_1_Size – 1) in Table_1
    do {
```

Finally, as seen in step 12B-6 and 12B-7, where the queue for the bucket is not empty, the segment at the head of the queue is removed and delivered to the reassemble.

Figure 12C:
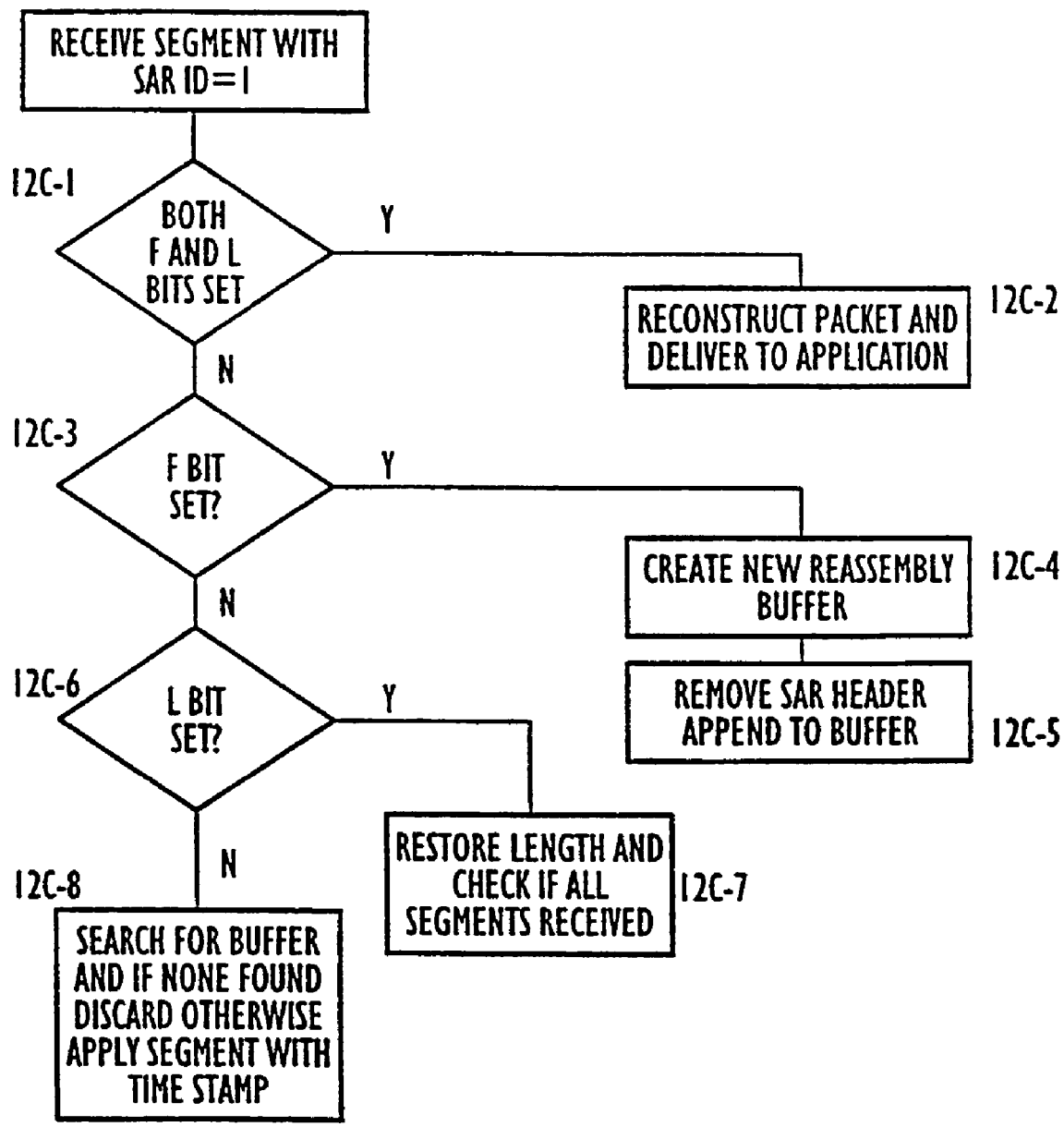

Note that in the above process, segments are first resequenced, then reassembled. This simplifies the reassembly algorithm. There is one reassembly buffer per source terminal per packet. These are stored in a data structure keyed by Source Terminal and packet sequence number. In accordance with the flowchart illustrated in FIG. 12C, on receiving a segment with Said equal to 1 (variable length packet) from the resequencer, the following steps are followed after receiving such segment.

If both the F and L bits are set, as determined in step 12C-1, the packet consisted of only one segment. The packet is then reconstructed and delivered to the application in step 12C-2. Otherwise, if the F bit is set, as determined in step 12C-3, a new reassembly buffer is created in Step 12C-4. At that time, the SAR header is removed and the segment data is appended to the reassembly buffer in step 12C-5. A time stamp also is applied to the buffer with the current time. if the F bit is not set, as determined in step 12C-3, a check is made as to whether the L bit is set in step 12C-6. if the L bit is not set, in step 12C-8, a search is made for the reassembly buffer and if no reassembly buffer is found, the segment is discarded. If a reassembly buffer is found, the segment data is appended to the buffer. Finally, if only the L bit is set, in step 12C-7 ,the length is restored and a check is made as to whether all segments have been received (based on the length). if so, deliver the packet to the application, else discard the packet. At the end, the reassembly buffer is destroyed.

Periodically the reassembly buffers are scanned and those whose time stamps are too old. (greater than 1 sec) are discarded. This prevents sequence number wrap around.

On receiving a segment with SARId=0 (an ATM segment), there is no reassembly. The 1 byte SAR header is popped and the segment is delivered to the application.

Figure 13A:
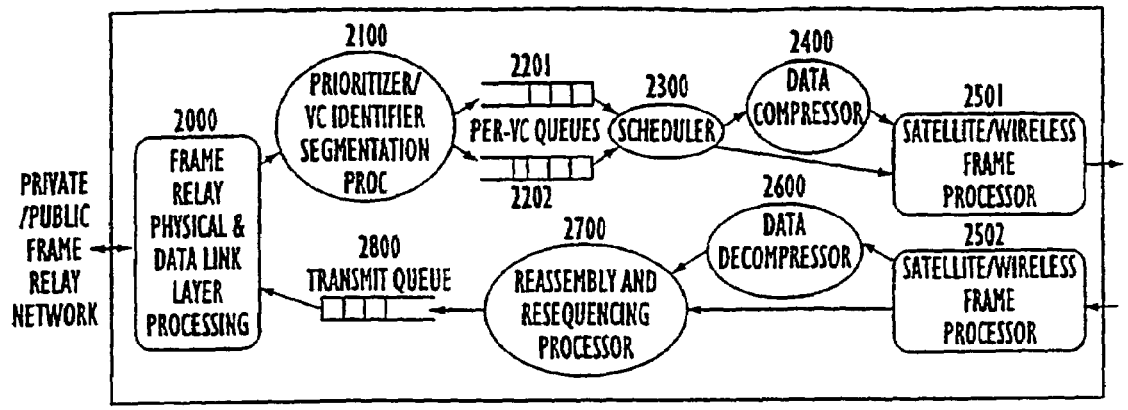
FIG. 13A is a high level description of a frame relay system, with FIG. 13B illustrating the various fields in a Spacket and FIG. 13C illustrating a Spacket frame.

FIG. 13A is a high level description of a frame relay system that performs frame relay processing to efficiently carry frame relay packets over wireless/satellite links. This system can perform the following:

Frame Relay processing at the Physical Layer and the Data Link Layer

Formatting of Data (variable length packets, segmentation and reassembly, resequencing)

Dynamic Forward Error Coding

Interleaving of frames (to spread the effect of burst errors)

Per-VC data compression

Prioritization and Scheduling

Header Compression

In the high level description of the various functions performed in the system seen in FIG. 13A, to the left of the diagram is the private/public frame relay network and to the right is the satellite/wireless link.

The illustrated system uses a robust, flexible frame format between the 2 communicating terminals which allows the transport of several variable sized Sackets (segmented packets) in a frame and also to carry a single Spacket over several frames, whichever the case might be. Also, the frame format allows fast synchronization and the exchange of coding information. Each frame contains Reed-Solomon check bytes that are used for error correction and to enhance the quality of the satellite/wireless link. The number of RS check bytes in a frame can be changed on the fly, without any loss of data, to compensate for varying link conditions. The decision to change the RS check bytes in a frame is based on the constant monitoring of the link quality. Several frames are also interleaved before transmission over the satellite/wireless link, to help spread the effect of burst errors over several frames, all of which can then be corrected by the FEC in the frames. Also, Virtual Channels (VCs) can be configured to be enabled for data is compression, which means that the Sackets belonging to the VC are to be passed through a data compressor/decompress or combination to save bandwidth. VCs can also be configured to be either high or low priority VCs and the scheduler then, uses this information to fairly transmit the various Sackets over the satellite/wireless link.

In operation, a private or public frame relay network provides the frame relay packets to the frame relay physical and data link layer processing block 2000, where they are received and processed as specified in ITU recommendation Q.922 (Link Access Procedures for Frame Relay). The physical layer processing is similar to the processing of any HDLC data stream. This is the processing performed in most Frame Relay Access Devices (FRADs).

A frame relay packet received from the terrestrial network consists of payload data and a CRC field, and flags at the beginning and the end of the frame. The frame relay processing removes the flags and the CRC fields and transports only the payload section of the frame relay packet over the satellite link. The CRC and the flag information is regenerated at the receiving terminal and added to the packet before it is transmitted to the receive side terrestrial network.

Figure 13B:
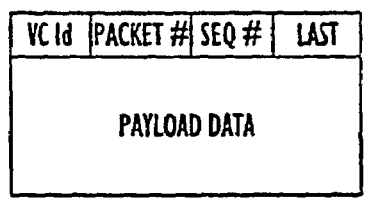

In prioritize/VC identifier/Segmentation processor 2100, the variable length frame relay packets are segmented into several smaller packets called Sackets. The Sackets allow efficient scheduling of packets belonging to multiple priorities and loss less data compression. FIG. 13B illustrates the various fields in a Spacket, whose content provides for efficient processing of the Sackets, as subsequently described.

In order to avoid an intolerable delay of high priority packets. (e.g., audio and video) due to processing and transmission of low priority packets, Sackets belonging to a high priority packet could be transferred after a single Spacket from a low priority packet has been transferred, thus minimizing the delay variance that the high priority packet experiences. This technique minimizes the delay variance significantly and the satellite/wireless network performance is better than terrestrial networks, as far as delay variance is concerned. Thus, when each frame relay packet is segmented into one or more Sackets, all but the last lo Spacket are n bytes long. The last Spacket could also be n bytes long if the frame relay packet, to begin with, was of a length that was an integral multiple of n. A Spacket is then propounded with a header as shown in FIG. 13B that contains a Virtual Channel (VC) Identifier for the channel to which the packet belongs. Also, the header is supplied with the packet and the sequence numbers. The packet number increments for each new frame relay packet. The sequence number increments for each Spacket within the frame relay packet. Information about the priority of the packets and whether or not the packets are compressed is maintained locally. All this information is used to perform segmentation/reassembly, data compression/decompression, prioritization and scheduling. The "last field" indicates whether or not the Spacket is the last Spacket for the frame relay packet. If it is, then at the receiving terminal, the frame relay packet can be reassembled and transmitted over the terrestrial link.

The sizes of the various fields can be left to the discretion of the system designer. The VC Id field would either be the size of the entire VC field in the frame relay packet or could be the size specified in the header compression parameters. The size of the Packet number and Sequence number are also left to the system designer. The "last field" is a single bit. The size of the payload is determined by a trade-off between the overheads and the performance of the system. If the payload size is very low, the overheads will be very high, but the delay variance performance of the system will be very good. If the payload size is set to a large value, then the delay is variance performance will be poorer but the overheads will be lower. Hence, the sizes would depend on the overheads the designer is prepared to allow, and the performance specifications of the system.

Next, queues of Sackets belonging to different VCs are stored for use by the scheduler in Per-VC or priority queues 2201 and 2202. In the case of a priority queue, high priority queues 2201 and low priority queues 2201 are maintained and the cells in each priority queue are transmitted on a FIFO basis. A more preferable mode of queuing is to have a queue for each VC, which is designated to have a high or low priority, and then store the cells belonging to each VC in its corresponding queue. Cells in these per-VC queues are also transmitted on a FIFO basis to preserve sequence integrity.

A scheduler 2300 sends Sackets belonging to various priorities or VCs over the satellite link. The scheduler is designed to be fair to VCs within a priority and between priorities as well. If the Spacket is to be compressed then it is sent to the Data Compressor 2400. The scheduler 2300 uses all the priority information for the various VCs and tries to be fair in the scheduling of the Sackets. A simple scheduling algorithm is to process all the high priority per-VC queues on a round-robin basis and then to process all the low priority per-VC queues on a round-robin basis. Another option for the scheduler would be to transmit at least one low priority cell every "n" high priority cells. This could assure some degree of fairness between priorities. A further option would be, within a priority, to use a weighted round-robin scheduling algorithm to transmit cells from per-VC queues, the weights reflecting the bandwidths that the VCs have subscribed for. This scheduling algorithm will attempt to schedule different VCs fairly.

Sackets which belong to a VC which has been specified to be compressed are compressed in data compressor 2400. To achieve loss-less data compression, the compression and decompression histories are reset every n Sackets, where n is a configurable parameter. With the FEC, the link is maintained at a very low BER. If a Spacket does get corrupted, then the resetting of the histories, will ensure that not more than n Sackets are affected.

Figure 13C:
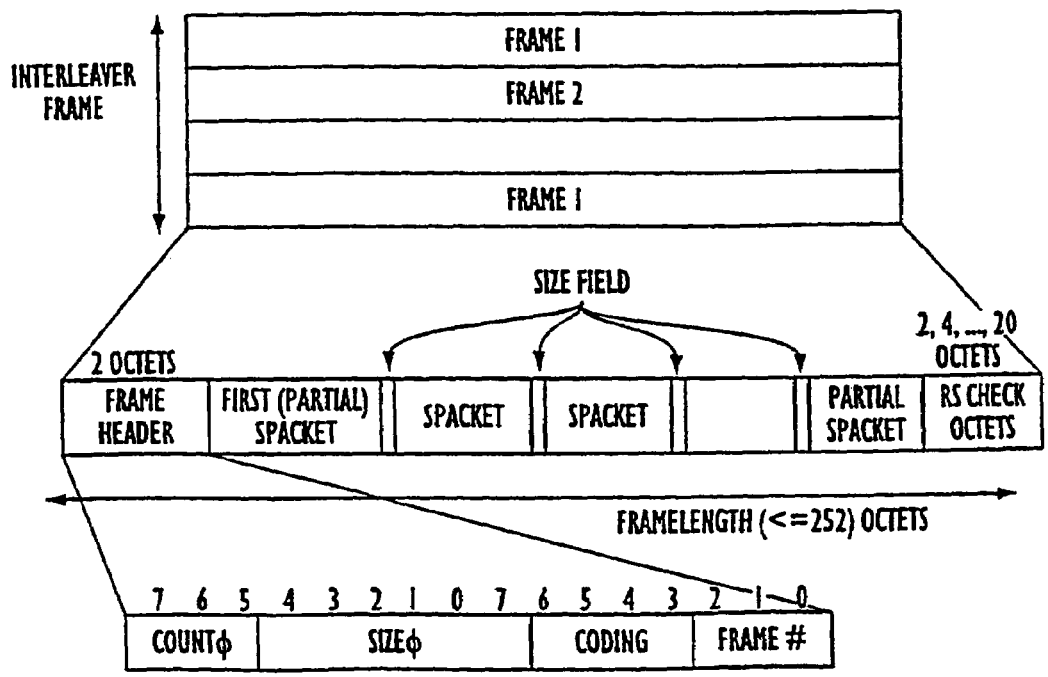

Finally, the compressed or uncompressed Sackets are provided to a satellite/wireless frame processor 2501, which incorporates the Sackets into a frame for transmission over the satellite/wireless link. This frame structure has been designed to facilitate fast frame synchronization, accommodation of several variable-size packets, fast recovery from lost frames, very low is bandwidth overhead, as well as dynamic Reed-Solomon coding change without introducing data loss during the coding rate change transition. FIG. 13C shows the frame format.

The fundamental unit of transmission over the satellite/wireless link is a fixed size frame, which is n octets long. If an interleaving depth of I is used, then I such frames are used to compose an "interleave frame". The interleave rearranges the order of the bytes in the interleave frame and transmits each byte sequentially over the satellite/wireless link. It should be noted that there are no special synchronization bits in this frame structure.

Each frame is n bytes long and consists of:

a 2-octet header followed by the frame payload, and terminated by 2t octets (t>0) of Reed-Solomon coding check bytes in the end.

TABLE 1

| | |
|---|---|
| Count0 | Number of Spackets in frame. Does not include the first Spacket, if any Includes the last Spacket, if any |
| Size0 | Size of first partial Spacket in frame divided by 4. |
| FrameNum | The frame number Each frame is sequentially numbered 0, 1, . . . , 7, 0, . . . |
| Coding | If FrameNum > 3, the coding field represents the number of Reed-Solomon octets/2 that will be used starting with the next frame numbered 0. Note that 0 is an invalid value for the coding field. If FrameNum == 0, the coding field represents the suggested value of the number of Reed-Solomon octets/2 that the other side should use for its own transmission. If the coding field value is 0xF, the value implies that the transmitting terminal is not yet synchronized to its receiving bit stream. Note that 0 is an invalid value for the coding field. If FrameNum == 1, the least significant bit of the coding field is 1 if Spacket header compression is activated at the transmitting terminal, 0 otherwise. Other bits of the field are reserved for future use. If FrameNum is 2 or 3, the coding field shall be set to 0's. |

The payload contains a combination of several variable-size packets (the packets may contain compressed or uncompressed Sackets).

The rules for filling a frame payload with Sackets are as follows:

1. If the previously transmitted frame contained a partial Spacket at the end of the payload, the frame payload currently being transmitted begins with the next portion of that Spacket. This portion shall consume min(4 * size0, payload_size) octets of the payload, where size0 0. The actual size of this partial Spacket may be up to three octets less than 4 * size0, in which case the extra octets shall be filled with zeroes.

2. After the initial partial Spacket segment, the payload contains count0 Spackets where count0 0. If the last Spacket cannot be entirely contained in the payload, then only its initial portion is included in the payload. Each Spacket is preceded by a 1-octet-length (in octets) field followed by the Spacket contents. The length field contains the size of the Spacket in bytes.

3. If there are any octets left over in the payload, then the first such unused octet shall contain a zero. The rest of the octets, if any, shall be filled sequentially with the numbers i, i+1, i+2, . . . , where i is the octet number of the first such octet in the payload (octets in the payload are implicitly numbered 0, 1, . . . ).

From these rules, one can see that a frame payload may contain several Spackets and that the Spackets can be transmitted over more than one frame. A frame with no Spackets contains the sequence 0, 1, 2, . . . in the payload. A Spacket may be split across more than two frames if required.

This frame structure design allows the possibility of dynamically changing the Reed-Solomon code size by correspondingly changing the payload size but keeping the frame size constant. If the receiver "loses" a frame, for example, due to excessive bit errors in the frame, the size0 field allows rapid determination of the Spacket boundary on the very next frame. The frame header, shown in FIG. 11C, has four fields which are described in Table 1, wherein the Reed-Solomon check-bytes are the check-bytes generated by a standard Reed-Solomon algorithm with frame size=N bytes and number of check bytes=2t.

During the time that the system has not achieved receive synchronization, it sets the Reed-Solomon code value of its receiver and its transmitter to the maximum value. After the system achieves receive synchronization and it detects that the remote terminal has also achieved receive synchronization (i.e., the coding field in the received frame header of frame number 0 contains a valid code value), it activates an adaptive coding algorithm.

Transmissions from the satellite/wireless network are received and processed by a Satellite/Wireless frame processor 2502, which performs the inverse operation of that performed by the frame processor 2501, strips the Spackets from the frame format and produces the compressed and un-compressed Spackets.

Next, compressed Spackets are sent to Data Decompression module 2600, which decompresses the Spackets belonging to a VC which has been configured to be compressed. Compression and decompression histories are maintained in the Data compressor 2400 and the decompress or 2600, respectively. These histories are reset once every n Spackets, where n is a configurable parameter. This is done to minimize the effect that a lost or erroneous Spacket has on the following Spackets.

A reassembly and resequencing processor 2700 keeps track of Spackets belonging to all the VCs. The reassembly algorithm works on a per-VC basis. The Spackets for each VC are resequenced based on the sequence and packet numbers. The following rules are used to reassemble frame relay packets:

If a Spacket with a sequence number of zero is received, discard any previous incompletely assembled frame relay packet and start reassembling this new packet.

If a Spacket with the same packet number and VC Id, with a sequence number one more than the previous Spacket is received, then append this Spacket to the partially reassembled frame relay packet. If the "last field" indicates that the Spacket is the last Spacket of a frame relay packet, the frame relay packet has been completely assembled.

If a Spacket with sequence number which is out of sequence, and non-zero, is received, discard this new Spacket and any partially reassembled frame relay packet.

If the packet number of the Spacket received is not the same as that of the previous Spacket and the sequence number of the received Spacket is not zero, discard this new Spacket and any partially reassembled frame relay packet.

Optionally, a length field could be added to the frame relay packet at the transmitting terminal before it is segmented and transmitted over the satellite/wireless link. This length field could be used at the receiving terminal to check if the frame relay packet has been reassembled properly. If it hasn't then the frame relay packet is added to the transmit queue A transmit queue 2800 contains frame relay packets received from the remote terminal which will be transmitted over the terrestrial link. These packets are processed by the frame relay physical and data link layer processing module and transmitted over the terrestrial link.

Finally, the frame relay physical and data link layer processing module 2000 will reassemble the Spackets in to the appropriate frame relay configuration for transmission over the private or public network.

In order to save bandwidth, a header compression technique, similar to that used for ATM transmissions as described previously, may be used to compress the VC Id of a frame relay packet into a smaller value. This technique utilizes the fact that the number of VCs carried over the satellite/wireless link is not very large and can be compressed to a much smaller VC Id space. If header compression has been enabled in the system, then the VCs are mapped into a new value as specified by the size of the compressed VC field. This header compression information is periodically exchanged between the communicating terminals. Also, every time a new mapping is created, this information is asynchronously exchanged between the terminals before the actual transfer of the mapped packet begins.

The present invention would be applicable to the frame relay implementation described above, where bandwidth on demand is required and a plurality of terminals are co-located at a site and the capacity of co-located terminals is accessed for transmission of information requiring capacity in excess of the normal capacity at a given terminal or modem, as seen in FIG. 4. As described generally with regard to the preferred embodiment, the algorithms set forth in FIGS. 11 and 12, using the frame and header configurations seen in FIGS. 6-10, can be used to transmit frame relay signals as illustrated in FIGS. 13B and 13C. The satellite/wireless frame processors 2501 and 2502 would be adapted to provide the functions seen in the algorithms of FIGS. 11 and 12, as would be apparent to one of ordinary skill in the art.

While the present invention has been described in connection with certain preferred embodiments, it is not limited thereto and the scope of protection to which the invention is entitled is defined by the appended claims invention in accordance with applicable principles of law.

What is claimed is:

1. A communication system for efficiently transmitting information signals that were formatted in variable sized packets of more than a minimum size by using time division transmission of packet segments and allocating available bandwidth on demand, said system comprising:
   a satellite/wireless network;
   at least two sites, each comprising a plurality of terminals operative to transmit and receive signals via said satellite/wireless network and a local area network for interconnecting said terminals at a common site, each said terminals comprising:
   (a) a modem for transmitting signals from a terminal on predetermined channels having a predetermined bandwidth;
   (b) means for time dividing data signals input to said terminal from an external location and for assembling said time divided data signals as bursts within repeated frames, each frame having a unique frame header;
   (c) means for dividing information signals arranged in variable sized packets into a plurality of segments;
   (d) means for combining each segment in said plurality of segments with a unique segment and reassembly header to form a SAR segment;
   (e) means for combining said SAR segments representing a single packet with a unique frame header to form a SAR frame; and
   (f) means for selectively appending a terminal ID header to each said SAR frame for transmission in a burst from a modem.

2. The communication system as set forth in claim 1 wherein each terminal further comprises:
   (g) means for detecting said SAR frame and for dividing said SAR frame into SAR segments;
   (h) means for rearranging the segments in said SAR segments on the basis of said SAR header; and
   (i) means for reassembling said packets on the basis of said rearranged segments.

3. The communication system as set forth in claim 2 further comprising means for receiving a SAR frame on the basis of said terminal ID information.

4. The communication system as set forth in claim 2 wherein said SAR frame comprises information defining the total length of said plurality of SAR Segments representing a single packet.

5. The communication system as set forth in claim 2 wherein said SAR segment comprises at least a signal identifying the packet sequence number for said segment.

6. The communication system as set forth in claim 2 wherein said SAR segment comprises at least a signal identifying a SAR id of such header.

7. The communication system as set forth in claim 2 wherein said SAR segment comprises at least a signal indicating whether a given segment is first or last among said plurality of segments defining a variable size packet.

8. The communication system as set forth in claim 2 wherein said SAR segment comprises at least a signal identifying at least one receiving modem for said packet.

9. The communication system as set forth in claim 2 wherein said terminal ID header comprises at least one of control group, site and unit information.

10. The communication system as set forth in claim 2 wherein said SAR header comprises one byte having identification information about a sending terminal and a receiving terminal.

11. The communication system as set forth in claim 10 wherein said SAR segment is for point to point bursts between sites having only one terminal each.

12. The communication system as set forth in claim 1 further comprising means for detecting the needed bandwidth for transmitting information signals and for allocating segments of a single packet to respective ones of multiple modems.

13. The communication system as set forth in claim 2 further comprising a central network controller for assigning bandwidth among plural modems on a per packet basis.

14. The communication system as set forth in claim 2 further comprising a controller distributed among plural modems for assigning bandwidth among plural modes on a per packet basis.

15. The communication system as set forth in claim 2 further comprising means for filling a SAR segment with fill data when said packet does not have sufficient data to completely fill a segment.

16. The communication system as set forth in claim 2 wherein said SAR segment has a uniform size data content.

17. The communication system as set forth in claim 16 wherein said size is identical to the size of an ATM cell.

* * * * *